(12) United States Patent
Kano et al.

(10) Patent No.: US 7,438,950 B2
(45) Date of Patent: Oct. 21, 2008

(54) METALLIC PATTERN FORMING METHOD AND CONDUCTIVE PATTERN MATERIAL

(75) Inventors: Takeyoshi Kano, Shizuoka-ken (JP); Koichi Kawamura, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 405 days.

(21) Appl. No.: 11/141,055

(22) Filed: Jun. 1, 2005

(65) Prior Publication Data
US 2005/0266352 A1 Dec. 1, 2005

(30) Foreign Application Priority Data
Jun. 1, 2004 (JP) ............................. 2004-163778

(51) Int. Cl.
B05D 3/02 (2006.01)
B05D 3/04 (2006.01)
B05D 5/12 (2006.01)
C08F 2/48 (2006.01)

(52) U.S. Cl. ...................... 427/304; 427/58; 427/126.1; 427/301; 427/372.2; 427/508; 427/532; 427/553; 427/557; 427/558; 427/595

(58) Field of Classification Search ................. 427/508, 427/532, 553, 557, 558, 595, 372.2, 58, 126.1, 427/301, 304
See application file for complete search history.

(56) References Cited

U.S. PATENT DOCUMENTS
6,811,878 B2 * 11/2004 Kawamura et al. .......... 428/402

FOREIGN PATENT DOCUMENTS
EP 1271561 A2 * 1/2003
JP 58-196238 A 11/1983
JP 2003-046223 A 2/2003

OTHER PUBLICATIONS

En Tang Kang et al., "Surface Modification of Fluoropolymers via Molecular Design", Advanced Materials, 2000, vol. 12, No. 20, Oct. 6, pp. 1481-1494.
N. Inagaki et al., "Improved Adhesion between Kapton Film and Copper Metal by Plasma Graft Polymerization of Vinylimidazole", Macromolecules, 1996, vol. 29, pp. 1642-1648.

* cited by examiner

*Primary Examiner*—Elena Tsoy
(74) *Attorney, Agent, or Firm*—Sughrue Mion, PLLC

(57) ABSTRACT

The invention provides a metallic pattern forming method comprising: forming a region in which a graft polymer, that directly bonds to a surface of a base material that includes a polyimide and has a functional group that interacts with either an electroless plating catalyst or a precursor thereof, is generated in a pattern shape; imparting either an electroless plating catalyst or a precursor thereof and electroless plating so as to form a metallic film in the pattern shape, wherein the polyimide has at least one structural unit represented by the following Formula (1) or Formula (2) and has a polymerization initiating site in a skeleton thereof.

Formula (1)

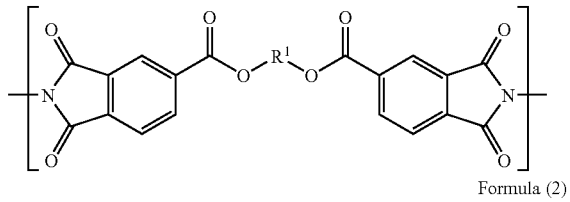

Formula (2)

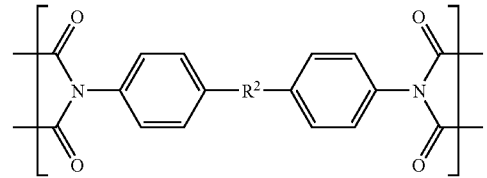

$R^1$ represents a bivalent organic group. $R^2$ is represented by one of Formulae (3) to (6).

Formula (3)

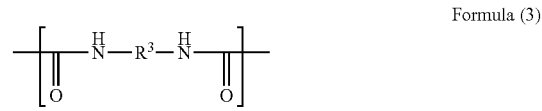

Formula (4)
Formula (5)

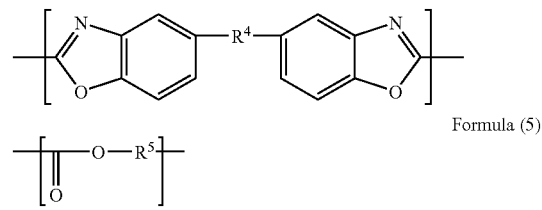

Formula (6)

$R^3$, $R^4$, $R^5$ and $R^6$ independently represents a bivalent organic group.

10 Claims, No Drawings

METALLIC PATTERN FORMING METHOD AND CONDUCTIVE PATTERN MATERIAL

CROSS-REFERENCE TO RELATED APPLICATION

This application claims priority under 35 USC 119 from Japanese Patent Application No. 2004-163778, the disclosure of which is incorporated by reference herein.

BACKGROUND OF THE INVENTION

1. Field of Invention

This invention relates to a metallic pattern forming method, specifically relates to a metallic pattern forming method that provides metallic patterns which can be used as metallic wiring pattern substrate or print wiring pattern substrate having dimensional stability, and further relates to a conductive pattern material that is obtainable by the method.

2. Description of the Related Art

As conventional methods of forming metallic patterns, a "subtractive method", a "semi-additive method" and a "full-additive method" are mainly known.

The subtractive method is a method in which a photosensitive layer reactive to irradiation of active light is provided on a metallic layer formed on a substrate, the photosensitive layer is subjected to image-wise exposure, the image is developed so as to form a resist image, the metal is etched so as to form a metallic pattern, and, as a final step, the resist is stripped. In the metallic substrate used in the above-mentioned method, an adhesion property is generated by means of an anchor effect resulting from applying an unevenness process to an interface between the substrate and the metallic layer in order to adhere the substrate and the metallic layer to each other. As a result, the interface part of the finished metallic pattern relative to the substrate is rendered uneven, which unfavorably deteriorates a high-frequency characteristic when the metallic pattern is used as an electric wiring. As another problem, when the metallic substrate is formed, the substrate is subjected to the unevenness process, which requires a complicated step of treating the substrate with strong acid such as chromic acid.

In order to eliminate the above-mentioned problems, a method of simplifying the processing steps for the substrate by grafting a radically-polymerizable compound on a surface of the substrate so as to modify a property of the substrate surface (as examples of which, see Japanese Patent Application Laid-Open (JP-A) No. 58-196238, and pp 1481-1494 of "Advanced Materials", 20$^{th}$ edition, published in 2000) has been proposed. The metallic substrate formed in the above-mentioned method can be patterned by means of the subtractive method, but, the subtractive method has its own unique problem, that is, a so-called over-etching process in which a post-etching line width becomes thinner than a line width of a resist pattern is advantageous in order to form the metallic pattern having a fine line width by means of the subtractive method (for example, see JP-A No. 2004-31588). The reason why the over-etching process is problematic is that the formation of the fine metallic pattern directly by the over-etching process easily leads to the generation of a blurred line, a faint line, a broken line and the like, making it difficult to form a metallic pattern of 30 μm or less, which is disadvantageous for the formation of a favorable fine metallic pattern. The above-mentioned conventional method further creates a problem, from the standpoint of the environmental and pricing, because the metallic film present in any area other than the pattern portion is removed and therefore wasted in large amounts by the etching process and because the disposal of waste fluid generated by the etching process is costly.

In order to eliminate the above-mentioned problems, the metallic pattern forming method called the semi-additive method has been proposed. The semi-additive method is a method in which a thin ground substrate layer made of Cr or the like is formed on the substrate by means of plating or the like, a resist pattern is formed on the ground metallic layer, a metallic layer made of Cu or the like is formed on the ground metallic layer other than the region where the resist pattern is formed by means of the plating, the resist pattern is removed so as to form a wiring pattern, the wiring pattern is used as a mask to etch the ground metallic layer, and a metallic pattern is formed in the region other than where the resist pattern is formed. The method does not require the etching process, and therefore, is capable of easily forming a fine line pattern of 30 μm or less. The method is also effective from the standpoints of the environment and pricing because the metal is deposited only in a desired part by means of the plating. However, there is also a problem included in this method in that it is necessary to apply the unevenness process to the substrate surface in order to generate the adhesion property between the substrate and the metallic pattern, as a result of which the interface of the finished metallic pattern becomes uneven relative to the substrate and the high-frequency characteristic thereby deteriorates when the metallic pattern is used as an electric wiring.

The metallic pattern forming method called the full-additive method has also been proposed. The full-additive method is a method in which a resist pattern is formed on the substrate, the metal is deposited other than the region where the resist pattern is formed, and the resist pattern is thereafter removed. This method, which is also an etchingless method, enables the easy formation of a fine line pattern of 30 μm or less, but shares the same problem as in the case of the semi-additive method. Therefore, a novel metallic pattern forming method capable of forming a thin line pattern, reducing unevenness in the substrate interface, and reducing the waste fluid generated by the etching process is desired.

The substrate used for the formation of the wiring substrate is necessarily solder-resistant and is usually required to have heat resistance against approximately 250° C. Therefore, a polyimide substrate having a superior heat resistance is generally used. However, the problems associated with the metallic pattern forming method mentioned earlier remain unsolved even in using the polyimide substrate. Thus, a novel metallic pattern forming method is also desired for the formation of a metallic pattern on a polyimide substrate, which is superior in heat resistance. However, the current situation is that such a method has not yet been provided.

Also, when a polyimide substrate is used in conductive material applications such as flexible wiring, TAB (Tape Automated Bonding) tapes, laminated wiring substrates or the like, it is required that the moisture absorption ratio of the polyimide is as small as possible from the perspectives of reliability and dimensional stability. Again from the perspective of dimensional stability it is also required that the hygroscopic expansion coefficient is also low. This is because during electrical wiring type manufacturing processes there are repeated cycles of processes, such as washing/drying, where the polyimide substrate absorbs water and then is dried out. Consequently, as a result of moisture absorption/moisture loss in the base film, there are large changes in the dimensions of the metallic wiring parts, and this can lead to errors when mounting an IC chip or the like. It is also because when heat is added during mounting, the moisture content in the polyimide can evaporate, leading to large dimensional changes, which again can lead to the occurrence of errors. Also, since polyimide substrates are also used in application where they are bent or folded, a high degree of elasticity is required from the perspective of flexibility.

Regarding polyimides exhibiting high elasticity, such as those described in Japanese Patent Application Laid-Open (JP-A) No. 200346223 and in "Macromolecules" No. 29, p 1642 to p 1648 by N Inagaki, S Tasaka, and M Masumoto, if, for making the main chain of the polyimide, a general acid of pyromellitic dianhydride is used as the material to synthesize the polyimide, then the exhibiting of high elasticity can easily be achieved. However, polyimides which are obtained like this cannot exhibit low hygroscopicity because the polarization of the imide groups is high.

In order to overcome this problem, it is generally effective to reduce the quantity of imide groups in the molecular structure, and the use of flexible groups of long monomer chains within the main chain is common. However, if simply the number of imide groups in the molecular structure is reduced, then this can lead to a reduction in the elasticity and an excessive increase in the linear expansion coefficient, sacrificing dimensional stability. Also, another problematic point about the characteristics of conventional polyimides is that, if long linear monomers are used, then the molecular chain packing becomes difficult, and it is difficult to achieve sufficient toughness, and in some case it is difficult to form films. Like the above, the required characteristics of a polyimide need to consider lots of other perspectives as well as low linear expansion coefficient, reducing hygroscopicity, and increasing elasticity. However, the current situation is that if one characteristic is satisfied another is sacrificed, and obtaining a polyamide film possessing all of multiple good characteristics posses significant problems, with an influence on multiple-functions of conductive patterning materials to which polyimide films are applied.

SUMMARY OF THE INVENTION

The invention has been made in consideration of the above problems, and provides a method for forming a metallic pattern with high heat resistance and dimensional stability which: uses a polyimide base material with low hygroscopicity, low hygroscopic expansion coefficient, and high elasticity; can be used to form a fine metallic pattern according, to the pattern desired, and without the use of an etching process; and provides superior adhesion between the base material and the metallic pattern, even when the surface of the substrate has few irregularities.

The inventors of the invention, after investigating the above problems and undertaking diligent research have discovered that the dimensional stability of a conductive pattern can be maintained by: using a polyimide base material that has low hygroscopicity, low hygroscopic expansion coefficient, and high elasticity; using specific structural units; and, by using the polyimide introduced polymerization initiation sites on the structural skeleton thereof. In addition it has been discovered that when using such a polyimide base material, by applying energy, such as UV light, in the form of a pattern, the surface of the polyimide base material can easily be caused to have activation sites in a pattern shape (causing the occurrence of radicals). Further, by using these activation sites as the starting points, by using direct bonding to the base material and the interaction of an electroless plating catalyst, or a precursor thereof, with functional group containing graft polymers, the graft polymers can be formed with regions of generation in a pattern shape. By undertaking electroless plating of these regions the above objectives can be achieved and the invention has been made.

Namely, the invention provides a metallic pattern forming method comprising: forming a region in which a graft polymer, that directly bonds to a surface of a base material that includes a polyimide and has a functional group that interacts with either an electroless plating catalyst or a precursor thereof, is generated in a pattern shape; imparting either an electroless plating catalyst or a precursor thereof; and electroless plating so as to form a metallic film in the pattern shape, wherein the polyimide has at least one structural unit selected from the group consisting of those represented by the following Formula (1) or Formula (2) and has a polymerization initiating site in a skeleton thereof.

Formula (1)

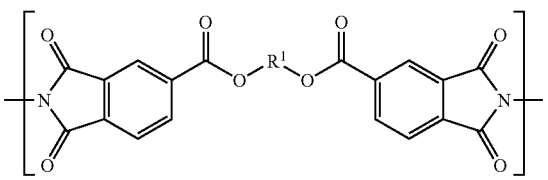

Formula (2)

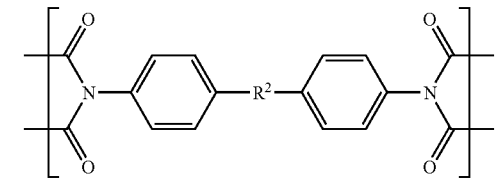

In Formulae (1) and (2), $R^1$ represents a bivalent organic group, and $R^2$ represents a partial structure represented by one of the following Formulae (3) to (6).

Formula (3)

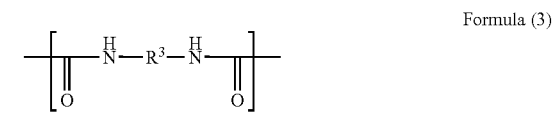

Formula (4)

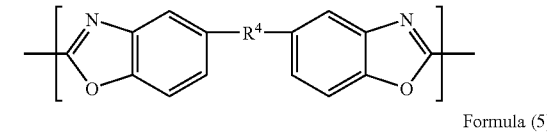

Formula (5)

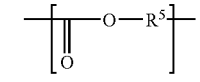

Formula (6)

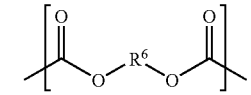

In Formula (3) to (6), each of $R^3$, $R^4$, $R^5$ and $R^6$ independently represents a bivalent organic group.

Further, the present invention provides a conductive pattern material having a metallic pattern comprising: a base material that includes a polyimide having at least one structural unit selected from the group consisting of those represented by the above-described Formula (1) or Formula (2) and having a polymerization initiating site in a skeleton thereof; a graft polymer that directly bonds to a surface of the base material in a pattern shape; and a conductive substance.

The metallic pattern forming method of the present invention can be effectively used for forming various electric elements such as a flexible printed circuit, which requires a fine circuit, a TAB (Tape Automated Bonding) tape, a multi-layer circuit and the like.

DETAILED DESCRIPTION OF THE INVENTION

Hereinafter, the present invention is explained in detail.

1. Metallic Pattern Forming Method

The metallic pattern forming method of the invention at least includes forming a region in which a graft polymer, that directly bonds to a surface of a base material that includes a polyimide and has a functional group that interacts with either an electroless plating catalyst or a precursor thereof, is generated in a pattern shape, imparting either an electroless plating catalyst or a precursor thereof, and electroless plating so as to form a metallic film in the pattern shape, in which the polyimide has at least one structural unit selected from the group consisting of those represented by the following Formula (1) or Formula (2) and has a polymerization initiating site in a skeleton thereof.

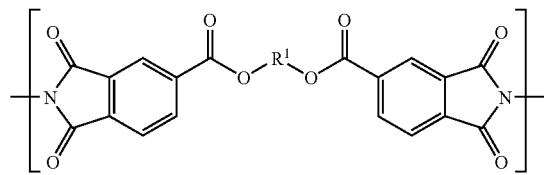

Formula (1)

In Formula (1), $R^1$ represents a bivalent organic group.

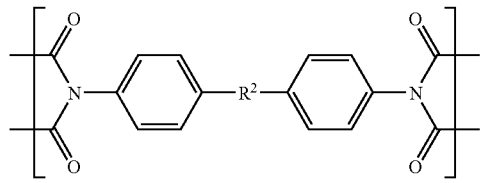

Formula (2)

In Formula (2), $R^2$ represents a partial structure represented by one of Formulae (3) to (6).

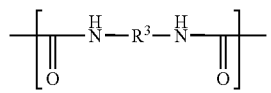

Formula (3)

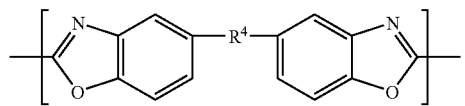

Formula (4)

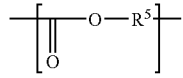

Formula (5)

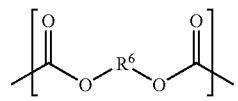

Formula (6)

In Formulas (3) to (6), each of $R^3$, $R^4$, $R^5$ and $R^6$ independently represents a bivalent organic group.

More preferred modes of the pattern forming method according to the first mode of the invention are methods described in (1) and (1), although the invention is not necessarily limited to those methods.

(1) A metallic pattern forming method characterized in that energy is applied to the surface of the base material including a polyimide having at least one structural unit selected from the group consisting of those represented by Formula (1) or Formula (2) and having a polymerization initiating site in a skeleton thereof to generate an activation site on the surface of the base material, a polymer compound layer made of the polymer compound directly bonded to the base material surface and having the functional group whose chemical structure is changed so as to obtain or lose an ability to interact with either an electroless plating catalyst or a precursor thereof in response to heat, acid or radiation is provided on the base material surface using the activation site as a starting point, and the heat, acid or radiation is applied to the polymer compound layer in the pattern shape so that a pattern comprising the region which interacts with either an electroless plating catalyst or a precursor thereof (an interactive region) is formed on the base material surface (hereinafter, referred to as a "metallic pattern forming method (1)").

(2) A metallic pattern forming method characterized in that bringing the compound having the polymerizable functional group and the functional group that interacts with either an electroless plating catalyst or a precursor thereof into contact with the surface of the base material including a polyimide having at least one structural unit selected from the group consisting of those represented by Formula (1) or Formula (2) and having a polymerization initiating site in a skeleton thereof to generate an activation site on the surface of the base material, the radiation is irradiated in the pattern shape to thereby generate the activation site on the base material surface, and the graft polymer is generated on the base material surface using the activation site as a starting point by means of graft polymerization so that the region which interacts with either an electroless plating catalyst or a precursor thereof (an interaction-property region) is formed in the pattern shape, imparting an electroless plating catalyst or a precursor thereof to the interactive region, and forming a metallic film in the pattern by electroless plating (hereinafter, referred to as a "metallic pattern forming method (2)").

In the metallic pattern forming method according to the invention, the region where the graft polymer having the functional group that interacts with the electroless plating catalyst or the precursor thereof is directly chemically bonded in the pattern shape is selectively supplied with the electroless plating catalyst or the precursor thereof and subsequently subjected to the electroless plating. Therefore, it is presumed that a metallic pattern with a high resolution can be easily obtained, in comparison to a metallic pattern forming method according to a conventional technology wherein an etching process using a resist pattern is performed, because the metal such as copper or the like is formed into multiple layers so as to generate the metallic pattern. Another advantage in the present mode is that there is no waste liquid generated from the etching process.

Further, in the metallic pattern forming method of the invention, the substrate is subjected to surface graft treatment (described in detail later). When an electroless plating catalyst, or precursor thereof, are applied to the surface graft layer, electroless plating is carried out, and surface graft polymer chains polymerize from the surface of the substrate, leading to increased mobility, and the action of the electroless plating catalyst, or the precursor thereof, becomes easier. Furthermore, due to this high mobility the penetration of the electroless plating liquid becomes easier and the electroless plating develops in and on the surface of the graft layer. As a result of this, it can be thought that the substrate interface of the metallic film areas with the polymer directly bonded to the substrate become a hybrid state. Because of this, it is thought that even when the irregularities on the substrate interface remain at the lowest level, adhesion is generated.

Furthermore it can be supposed that a conductive pattern material can be obtained which is high in heat resistance and favourable in dimensional stability because, according to the invention: the base material has low hydroscopicity, low hygroscopic expansion coefficient and superior heat resistance; the base material includes at least one of the structural units shown in Formula (1) and/or Formula (2), and includes a polyimide within the skeleton structure which is a polymerization initiation site; the graft polymer is directly introduced; and, at these locations metal is placed on the board.

Below, each of the elements of the metallic pattern forming method of the invention will be described in detail.

Pattern Forming

In the pattern forming according to the invention, the region where the polymer having the functional group that interacts with the electroless plating catalyst or the precursor thereof is directly chemically bonded to the base material in the pattern shape (interaction-property region) is formed.

First, the base material including a polyimide having at least one structural unit selected from the group consisting of those represented by Formula (1) or Formula (2) and having a polymerization initiating site in a skeleton thereof, which is used in the respective modes of the metallic pattern forming method according to the invention, is described in detail.

Production of Base Material Including a Polyimide Having at Least One Structural Unit Selected from the Group Consisting of those Represented by Formula (1) or Formula (2) and Having a Polymerization Initiating Site in a Skeleton thereof The base material according to the invention is a base material including the polyimide having at least one structural unit selected from the group consisting of those represented by Formula (1) or Formula (2) and having the polymerization initiating site in the polymer skeleton thereof (hereinafter, sometimes simply referred to as a "polyimide base material"). The "polymer skeleton" in the invention includes the main chain and side chain(s) of the polyimide.

The polymerization initiating site represents a moiety which can be activated by applied energy using a UV light or the like to thereby generate the activation site (radical speices) in the structure thereof. The activation site can be generated in such modes that the activation site is directly generated in the polymerization initiating site or that the generation of the activation site is induced in the polymerization initiating site and the vicinity thereof by extracting hydrogen from the vicinity of the polymerization initiating site.

The polyimide used as the base material in the invention is a polyimide including at least one structural unit selected from the group consisting of those represented by Formula (1) or Formula (2) and including the polymerization initiating site in the skeleton thereof (hereinafter, referred to as a "specific polyimide"). The inclusion of such structures enables the generation of the graft polymer, which will be described later, as well as exhibiting low hygroscopicity, low hygroscopic expansion coefficient and high elasticity, on the base material surface in an easy and simplified manner.

The polymerization initiating site in the specific polyimide in the invention is preferably included in the main chain In view of obtaining heat resistance and easiness in production, the polyimide preferably has the polymerization initiating site in main chain thereof.

The base material including the specific polyimide according to the invention can be prepared by implementing the following <1> to <3> in that order.
<1> Production of the polyimide precursor
<2> Molding of the polyimide precursor
<3> Change of the structure of the polyimide precursor into a polyimide structure through a heating process The above-mentioned processes <1> to <3> are described below.

<1> Production of Polyimide Precursor

The compound represented by the following Formula (7) is used as the polyimide precursor compound used for the production of the specific polyimide according to the invention.

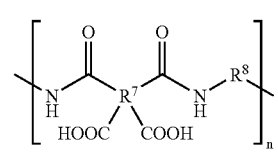

Formula (7)

In Formula (7), $R^7$ is a quadrivalent organic group, $R^8$ is a bivalent organic group, n is an integer of 2 or more. Also, the molecule for construction of any one of the polyimide precursor compound represented by Formula (7) includes as a structural unit for $R^7$ a structure represented by Formula (8) below and for $R^8$ a structure represented by Formula (9) below and, in $R^7$ and/or $R^8$ a structure which includes a polymerization initiating function.

In other words, in the same molecule there is included for $R^7$ and $R^8$ multiple structural units including a structure shown by Formula (8) below, a structure shown by Formula (9) below, and a structure which has a polymerization initiation function. The polymerization initiation function containing structure represented by Formula (7) corresponds to the specific polyimide polymerization initiation site of the invention. Further, it is preferable that the polymerization initiation function possessing structure has a photopolymerization function.

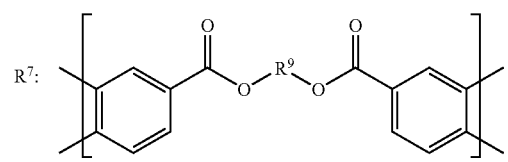

Formula (8)

In Formula (8), $R^9$ has the same meaning as $R^1$ in Formula (1).

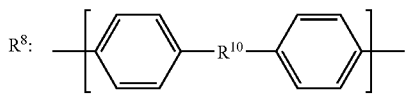

Formula (9)

In Formula (9), $R^{10}$ is one of the partial structures shown in Formulas (10), (11), (12) or (13) below. These correspond to each of the specific polyimide of Formulas (3), (4), (5) or (6) respectively.

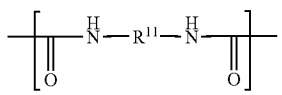

Formula (10)

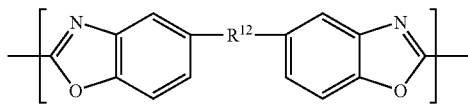

Formula (11)

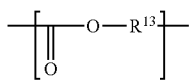

Formula (12)

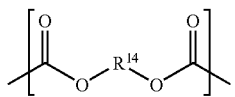

Formula (13)

$R^{11}$ in Formula (10), $R^{12}$ in Formula (11), $R^{13}$ in Formula (12), and $R^{14}$ in Formula (13) has the same meaning as $R^3$ in Formula (3), $R^4$ in Formula (4), $R^5$ in Formula (5), and $R^6$ in Formula (6) respectively.

From the perspective of the graft polymerization reaction undergone on the base material surface, the amount ratio of structures including the polymerization initiation function included in the $R^7$ and/or $R^8$ compounds of Formula (7) is preferably 10 mol % to 60 mol %, and more preferably 20 mol % to 60 mol %. Also, from the perspectives of hygroscopic expansion coefficient and dimensional stability, the amount ratio of the partial structures for $R^7$ shown in Formula (8), and/or the partial structures for $R^8$ shown in Formula (9) included are preferably 20 mol % to 70 mol %, and more preferably 25 mol % to 70 mol %.

The compound represented by Formula (7) can be obtained by reacting tetracarboxylic acid dianhydride represented by the following Formula (14) and a diamine compound represented by the following Formula (15) in an organic solvent. As additional elements, bivalent alcohols can be added.

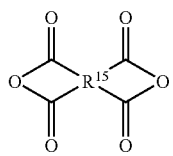

Formula (14)

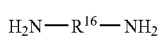

Formula (15)

$R^{15}$ shown in Formula (14) is equivalent to $R^7$ in Formula (1), and $R^{16}$ shown in the above Formulas (15) is equivalent to $R^8$ in Formula (15).

Tetracarboxylic Acid Dianhydride Represented by Formula (14)

When a partial structure represented by Formula (8) is introduced into a compound represented by Formula (7) by using a diamine compound represented by Formula (14), a compound represented by the following Formula (16) can be used.

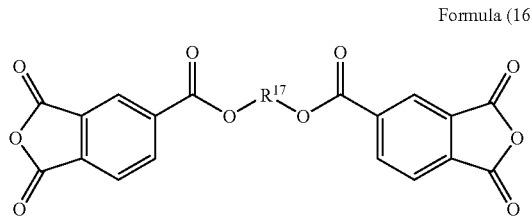

Formula (16)

In Formula (16), $R^{17}$ corresponds to $R^1$ in Formula (1) and $R^9$ in Formula (8), and represent a bivalent group. Preferable examples of the bivalent group include a straight-, a branched- or a cyclic-aliphatic group or a straight-, a branched- or a cyclic-aromatic group. Each of these groups may further has a substituent group if such a substituent group can be introduced thereto.

$R^{17}$ preferably represents a bivalent organic group selected from the group consisting of the structures represented by the following formulas. In the following formulas, $R^{18}$ represents $CH_3$—, Cl—, Br—, F—, $CH_3O$—, or a bivalent group formed by linking plurality of these. n represents an integer selected from 1 to 3. X represents a monovalent substituent group selected from the group consisting of a hydrogen atom, a halogen atom, a carboxyl group, a lower alkyl group having 1 to 6 carbon atoms, and a lower alcoxy group having 1 to 6 carbon atoms. Each of Y and Z independently represents a monovalent substituent group selected from the group consisting of a hydrogen atom, a halogen atom, a carboxyl group, a lower alkyl group having 1 to 6 carbon atoms, and a lower alcoxy group having 1 to 6 carbon atoms. A represents a bivalent linking group selected from the group consisting of an oxygen atom, a sulfur atom, —CO—, —SO—, —$SO_2$—, and —$CH_2$—.

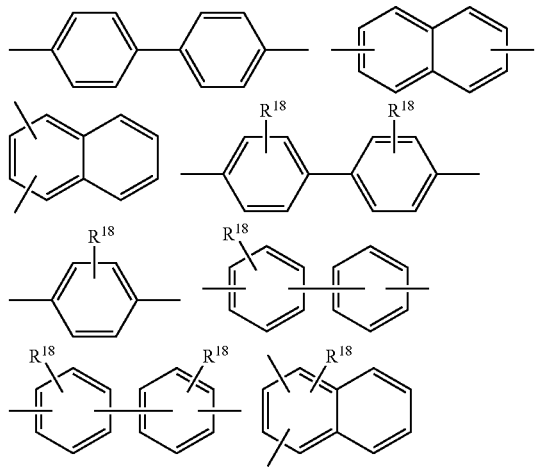

-continued

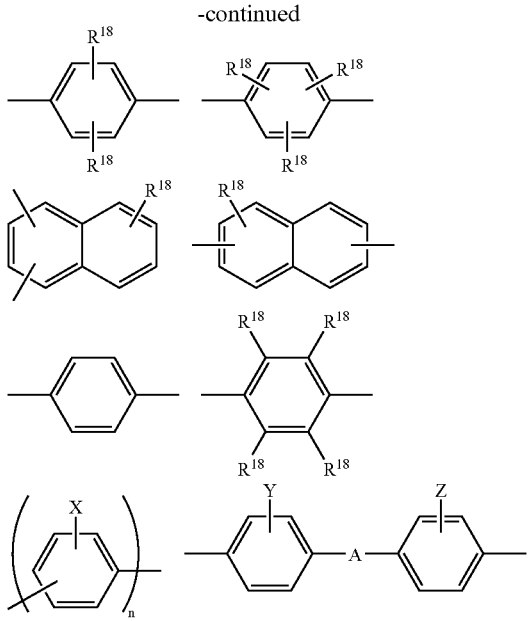

In addition to the above, examples of the tetracarboxylic acid dianhydride represented by Formula (14) include a pyromellitic acid dianhydride, 2,3,6,7-napthalene tetracarboxylic acid dianhydride, 1,4,5,8-napthalene tetracarboxylic acid dianhydride, 1,2,5,6-napthalene tetracarboxylic acid dianhydride, p-terphenyl-3,4,3'',4''-tetracarboxylic acid anhydride, m-terphenyl-3,4,3'',4''-tetracarboxylic acid anhydride, bicyclo (2,2,2) oct-7-ene-2,3,5,6-tetracarboxylic acid anhydride, ethylene tetracarboxylic acid dianhydride, cyclopentane tetracarboxylic acid dianhydride, pyromellitic acid dianhydride, 3,3',4,4'-biphenyl tetracarboxylic acid dianhydride, 2,2'3,3'-biphenyl tetracarboxylic acid dianhydride, 2,2-bis (3,4'-dicarboxyphenyl) propane dianhydride, 2,2-bis (2,3-dicarboxyphenyl) propane dianhydride, bis (3,4-dicarboxyphenyl) ether dianhydride, bis (3,4-dicarboxyphenyl) sulfone dianhydride, 1,1-bis (2,3-dicarboxyphenyl) ethane dianhydride, bis (2,3-dicarboxyphenyl) methane dianhydride, bis (3,4-dicarboxyphenyl) methane dianhydride, 2,2-bis (3,4-dicarboxyphenyl)-1,1,1,3,3,3-hexafluoropropane dianhydride, 2,2-bis (2,3-dicarboxyphenyl)-1,1,1,3,3,3-hexafluoropropane dianhydride, 2,3,6,7-naphthalene tetracarboxylic acid dianhydride, 1,4,5,8-naphthalene tetracarboxylic acid dianhydride, 1,2,5,6-naphthalene tetracarboxylic acid dianhydride, 1,2,3,4-benzene tetracarboxylic acid dianhydride, 3,4,9,10-perylene tetracarboxylic acid dianhydride, 2,3,6,7-anthracene tetracarboxylic acid dianhydride, 1,2,7,8-phenanthrene tetracarboxylic acid dianhydride and the like.

When $R^{15}$ in Formula (14) is the group that has the structure having the polymerization initiation property, examples of the the structure having the polymerization initiation property include (a) aromatic ketones, Examples of the structure having the polymerization initiation property (b) onium salt compounds, (c) organic peroxides, (d) thiocompounds, (e) hexarylbiimidazole compounds, (f) ketoxime ester compounds, (g) borate compounds, (h) azinium compounds, (i) active ester compounds, (j) compounds having a carbon halogen bond, (k) pyridiums compounds, and the like.

When $R^{15}$ is a group including a structure having a polymerization initiation property, the bonding of the carboxylic acid anhydride structures, two of which are included in Formula (14), and $R^{15}$ may be in any modes, and examples thereof include a mode in which the carboxylic acid anhydride structures are bonded at any spot in the structures having the polymerization initiation property; and a mode in which the carboxylic acid anhydride structures are bonded to any spot in the structures having the polymerization initiation property via linking groups.

In terms of the heat resistance of the polyimide, (a) aromatic ketones are preferably selected in the case of the structure having the polymerization initiation property. Specific examples of (a) aromatic ketones are mentioned below. However, the invention is not limited thereto.

Aromatic Ketones

In the invention, preferable examples of (a) aromatic ketones as the structure having the polymerization initiation property include compounds having a benzophenone skeleton or a thioxanthone skeleton described on pp. 77 to 117 of "*RADIATION CURING IN POLYMER SCIENCE AND TECHNOLOGY*" J. P. Fouassier, J. F. Rabek (1993). For example, the following compounds can be mentioned.

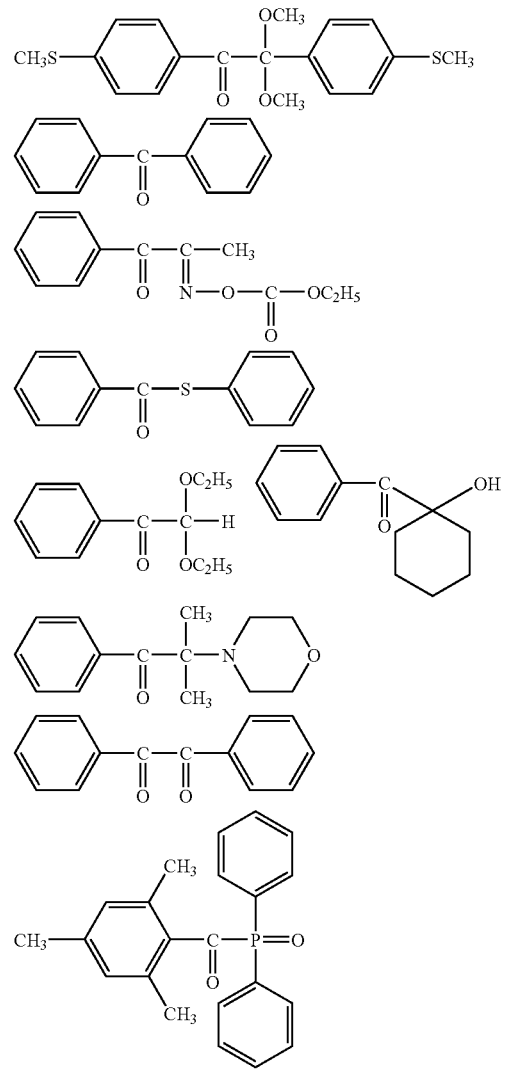

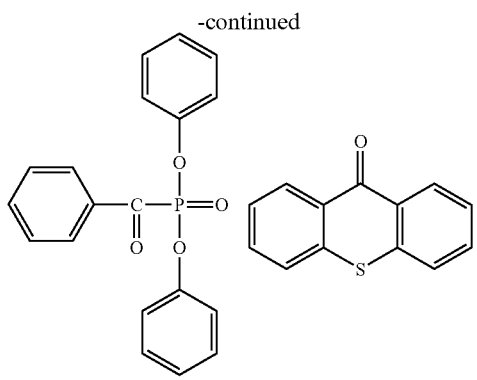

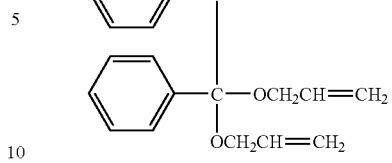

Preferable examples further include benzoin ethers described in JP-B Nos. 60-26403 and 62-81345, such as the following example.

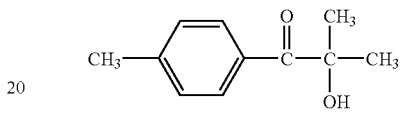

Particularly preferable examples of (a) aromatic ketones are listed below.

Particularly preferable examples of (a) aromatic ketones include α-thiobenzophenone compounds described in Japanese Patent Application Publication (JP-B) No. 47-4416 and benzoinether compounds described in JP-B No. 47-3981. For example, the following compound can be mentioned.

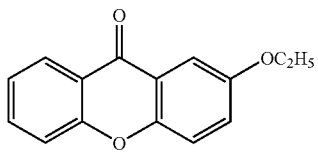

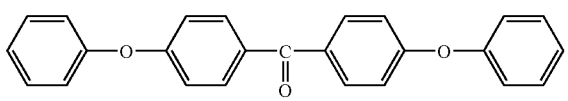

Preferable examples further include α-aminobenzophenones described in JP-B No. 1-34242, U.S. Pat. No. 4,318,791 and EP Patent No. 0284561A1, such as the following compounds.

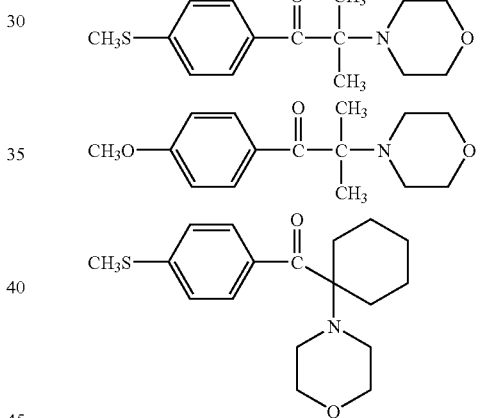

Preferable examples also include α-substituent benzoin compounds described in JP-B No. 47-22326, such as the following compound.

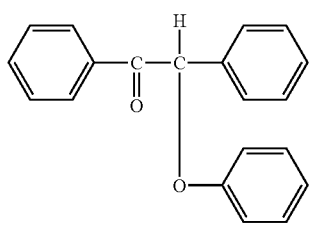

Preferable examples further include benzoin compounds described in JP-B No. 47-23664, aroylphosphonic acid esters described in JP-B No. 57-30704 and dialkoxybenzophenones described in JP-B No. 60-26483, such as the following compound.

Preferable examples further include p-di (dimethylaminobenzoyl) benzenes described in JP-A No. 2-211452, such as the following compound.

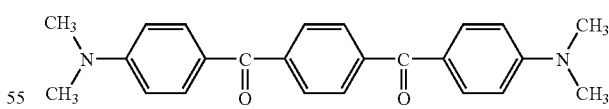

Preferable examples further include thio-substituted aromatic ketones described in JP-A 61-194062, such as the following compound.

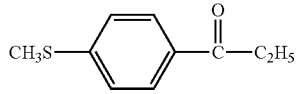

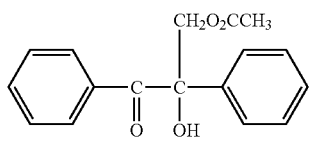

Preferable examples further include acylphosphine sulfides described in JP-B No. 2-9597, such as the following compounds.

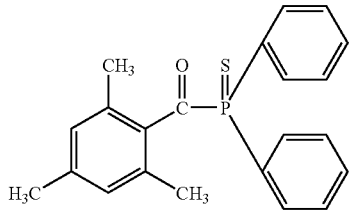

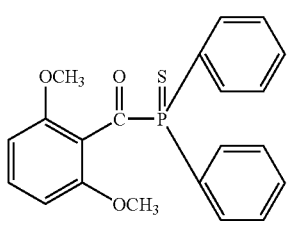

Preferable examples further include acylphosphines described in JP-B No. 2-9596, such as the following compounds.

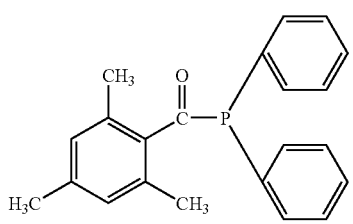

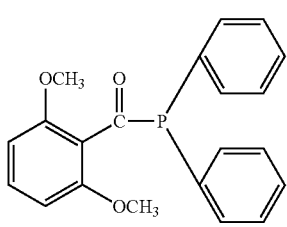

Preferable examples further include thioxanthones described in JP-B No. 63-61950 and coumarins and the like described in JP-B No. 59-42864.

Specific examples of the particularly preferred modes of the tetracarboxylic dianhydride represented by Formula (14), in which $R^1$ is the polymerization initiating group, are shown below. However, the invention is not limited to these examples.

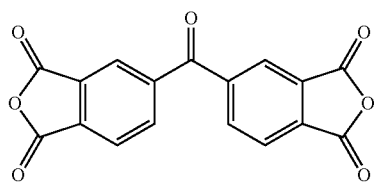

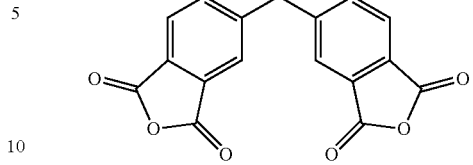

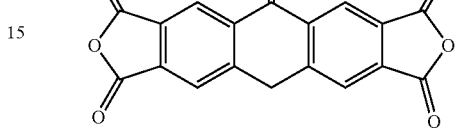

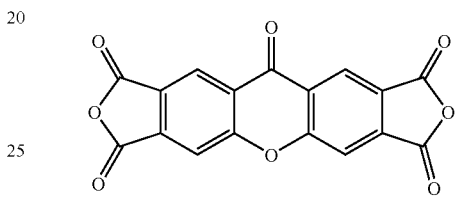

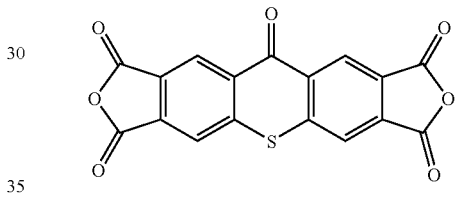

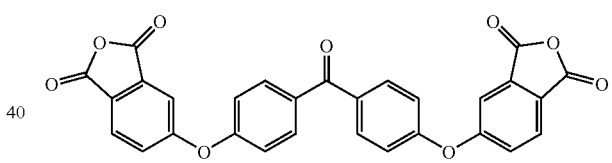

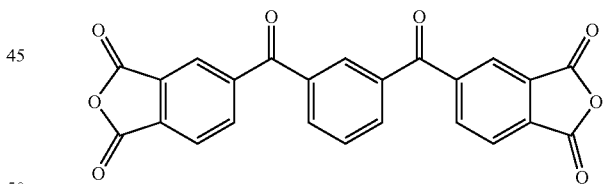

The tetracarboxylic dianhydride represented by Formula (14) may be used singly or in combination of two or more thereof.

Diamine Compound Represented by Formula (15)

When a partial structure represented by Formula (9) is introduced into a compound represented by Formula (9) by using a diamine compound represented by Formula (15), a compound represented by the following Formula (17) can be used.

Formula (17)

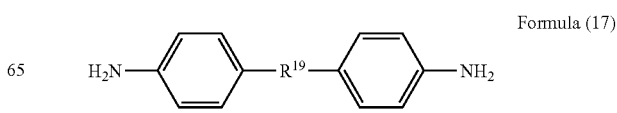

In Formula (17), $R^{19}$ represents a partial structure represented by the following Formulas (18), (19), (20) or (21).

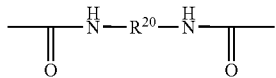
Formula (18)

In Formula (18), $R^{20}$ represents a straight-, branched-, or cyclic-alkyl group having 1 to 18 carbon atoms, an aralkyl group having 7 to 12 carbon atoms, an alkenyl group having 2 to 8 carbon atoms, an alkynyl group having 2 to 8 carbon atoms, an aromatic group having 6 to 18 carbon atoms, or a group containing aromatic groups linked with each other by a linking group(s). Each of these groups may further has a substituent.

Specific examples of the diamine compound represented by Formula (15), that contains a partial structure represented by Formula (18), include the following compounds.

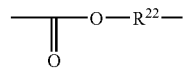
Formula (20)

In Formula (20), $R^{22}$ represents a single bond, a straight-, branched-, or cyclic alkyl group having 1 to 18 carbon atoms, an aralkyl group having 7 to 12 carbon atoms, an alkenyl group having 2 to 8 carbon atoms, an alkynyl group having 2 to 8 carbon atoms, an aromatic group having 6 to 18 carbon atoms, or a group containing aromatic groups linked with each other by a linking group(s). Each of these groups may further has a substituent.

Specific examples of the diamine compound represented by Formula (15), that contains a partial structure represented by Formula (20), include the following compounds.

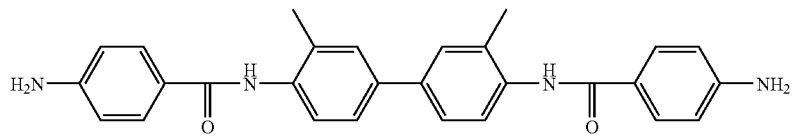

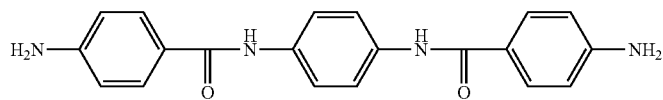

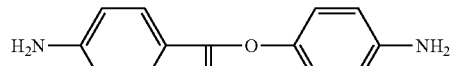

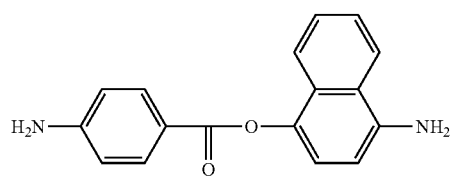

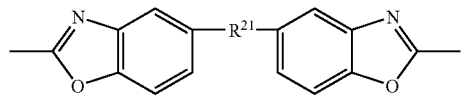
Formula (19)

In Formula (19), $R^{21}$ represents a single bond, a straight-, branched-, or cyclic-alkyl group having 1 to 18 carbon atoms, an aralkyl group having 7 to 12 carbon atoms, an alkenyl group having 2 to 8 carbon atoms, an alkynyl group having 2 to 8 carbon atoms, an aromatic group having 6 to 18 carbon atoms, or a group containing aromatic groups linked with each other by a linking group(s). Each of these groups may further has a substituent.

Specific examples of the diamine compound represented by Formula (15), that contains a partial structure represented by Formula (19), include the following compounds.

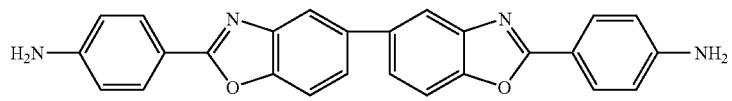

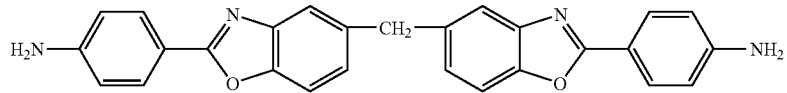

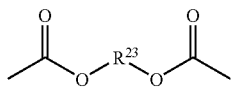

Formula (21)

In Formula (21), $R^{23}$ represents a bivalent organic group selected from the group consisting of the structures represented by the following formulas. In the following formulas, $R^{24}$ represents $CH_3$—, Cl—, Br—, F— or $CH_3O$—. n represents an integer selected from 1 to 3. B represents a monovalent substituent group selected from the group consisting of a hydrogen atom, a halogen atom, a carboxyl group, a lower alkyl group having 1 to 6 carbon atoms, and a lower alcoxy group having 1 to 6 carbon atoms. Each of C and D independently represents a monovalent substituent group selected from the group consisting of a hydrogen atom, a halogen atom, a carboxyl group, a lower alkyl group having 1 to 6 carbon atoms, and a lower alcoxy group having 1 to 6 carbon atoms. A represents a bivalent linking group selected from the group consisting of an oxygen atom, a sulfur atom, —CO—, —SO—, —$SO_2$—, and —$CH_2$—.

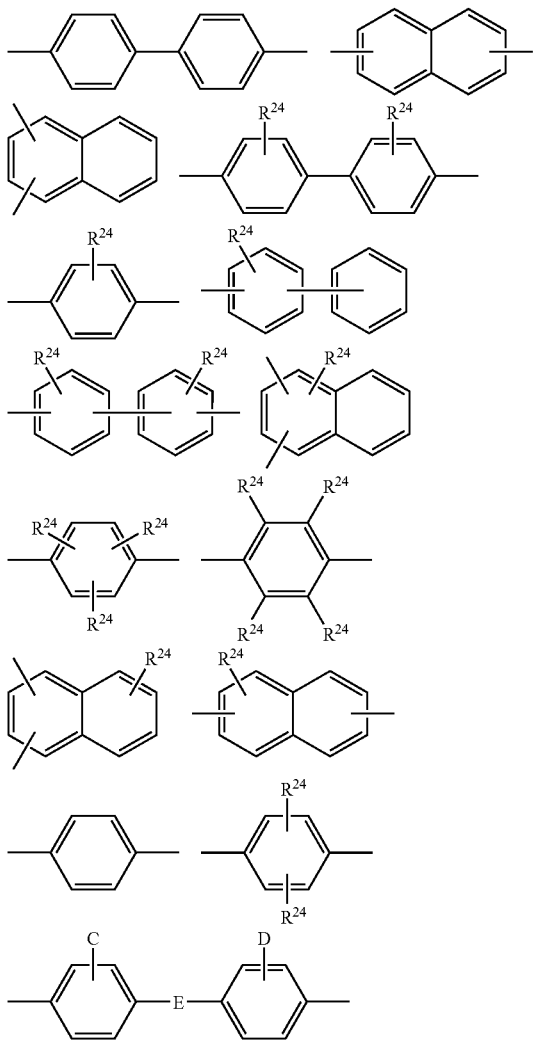

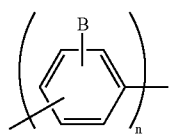

-continued

Specific examples of the diamine compound represented by Formula (15) include m-phenylenediamine, p-phenylenediamine, benzidine, 4,4"-diaminoterphenyl, 4,4-diaminoquaterphenyl, 4,4"-diaminodiphenylether, 4,4'-diaminodiphenylmethane, diaminodiphenylsulfone, 2,2-bis (p-aminophenyl)propane, 2,2-bis (p-aminophenyl) hexafluoropropane, 1,5-diaminonaphthalene, 2,6-diaminonaphthalene, 3,3'-dimethylbenzidine, 3,3'-dimethoxybenzidine, 3,3'-dimethyl-4,4-diaminodiphenylether, 3,3'-dimethyl-4,4'-diaminodiphenylmethane, 1,4-bis(p-aminophenoxy)benzene, 4,4-bis (p-aminophenoxy) biphenyl, 2,2-bis{4-(p-aminophenoxy)phenyl}propane, 2,3,5,6-tetraamino-p-phenylenediamine, and the like.

When $R^{16}$ in Formula (15) is the group that has the structure having the polymerization initiation property, examples of the structure having the polymerization initiation property include those similar to which described for $R^{15}$ in Formula (14), namely, (a) aromatic ketones, Examples of the structure having the polymerization initiation property (b) onium salt compounds, (c) organic peroxides, (d) thiocompounds, (e) hexarylbiimidazole compounds, (f) ketoxime ester compounds, (g) borate compounds, (h) azinium compounds, (i) active ester compounds, (j) compounds having a carbon halogen bond, (k) pyridiums compounds, and the like.

When $R^{16}$ is a group including a structure having a polymerization initiation property, the bonding of the amino group, two of which are included in Formula (14), and $R^{16}$ may be in any modes, and examples thereof include a mode in which the two amino groups are bonded at any spot in the structures having the polymerization initiation property; and a mode in which two amino groups are bonded to any spot in the structures having the polymerization initiation property via linking groups.

In terms of the heat resistance of the polyimide, (a) aromatic ketones are preferably selected as the structure having the polymerization initiation property.

Specific examples of (a) aromatic ketones similar to those described for Formula (14). However, the invention is not limited thereto.

Specific examples of the diamine compound represented by Formula (15), in which $R^{16}$ is a group including a structure having a polymerization initiation property, are shown below. However, the invention is not limited thereto.

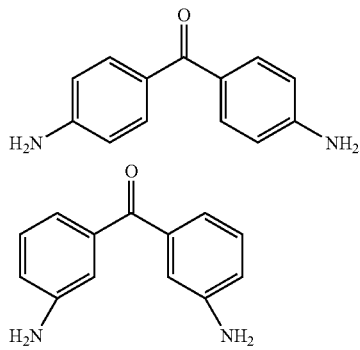

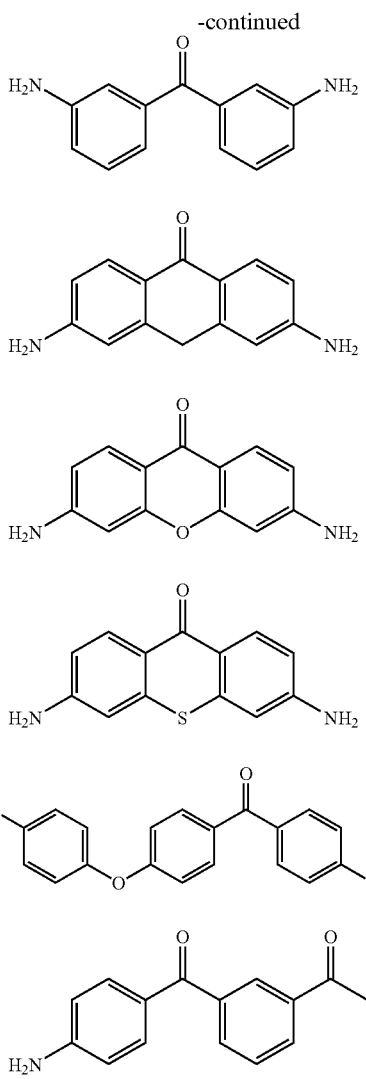

The diamine compound represented by Formula (15) may be used singly or in combination of two or more thereof.

Synthesis of Compound Represented by Formula (7)

The polyimide precursor compound represented by Formula (7) can be synthesized by using a tetracarboxylic acid anhydride represented by Formula (14) and a diamine compound represented by Formula (15), and a dialcohol compound in accordance with needs.

Specific example of the synthesis is that a diamine compound represented by Formula (15) is dissolved in a solvent, a tetracarboxylic acid anhydride represented by Formula (14) is added, and a reaction is conducted under a reaction temperature, which is less than 0° C. or in a range of 40 to 80° C. and selected in accordance with the compounds used therein.

Solvent

The solvent used in the synthesis can be appropriately selected with regard to a solubility of each constituent. Suitable examples include ethylene dichloride, cyclohexanone, cyclopentanone, 2-heptanone, methylisobutyl ketone, γ-butyrolactone, methyletyl ketone, methanol, ethanol, dimethylmidazolidinone, ethyleneglycolmonomethyl ether, ethyleneglycolmonoethyl ether, ethyleneglycoldimethyl ether, 2-methoxyethyl acetate, ethyleneglycol monoethylether acetate, propyleneglycol monomethylether (PGME), propyleneglycol monomethyletheracetate (PGMEA), tetraethyleneglycoldimethylether, triethyleneglycol monobutylether, triethyleneglycolmonomethylether, isopropanol, ethylenecarbonate, acetic ether, butyl acetate, methyl lactate, ethyl lactate, methyl methoxypropionate, ethyl ethoxypropionate, methyl, ethyl pyruvate, propyl pyruvate, N,N-dimethyl formamide, dimethyl acetamide, dimethyl sulfoxide, N-methylpyrrolidone, tetrahydrofuran, diisopropyl benzene, toluene, xylene, mesitylene, N-methyl-2-pyrrolidone, dimethylformamide, hexamethylphosphorous amide, and the like. These solvents can be used singly or in a combination of two or more.

Among these, examples of particularly preferable solvents include propyleneglycol monomethyletheracetate, propyleneglycol monomethylether, 2-heptanone, cyclohexanone, γ-butyrolactone, ethyleneglycol monomethylether, ethyleneglycol monoethylether, ethyleneglycol monoethylether acetate, propyleneglycol monomethylether, propyleneglycol monoethylether, ethylene carbonate, butyl acetate, methyl lactate, ethyl lactate, methyl methoxypropionate, ethyl ethoxypropionate, N-methylpyrrolidone, N,N-dimethyl formamide, tetrahydrofuran, methylisobutyl ketone, xylene, mesitylene, and diisopropyl benzene.

A weight-average molecular weight of the compound (the polyimide precursor compound) represented by Formula (7) is generally approximately 1,000 to 10,000,000, preferably approximately 1,000 to 1,000,000, and more preferably approximately 2,000 to 1,000,000.

Specific examples of the polyimide precursor compound represented by Formula (7) are shown below. In the followings, n represents a repeating number of each unit. It should be noted that the invention is not limited thereto.

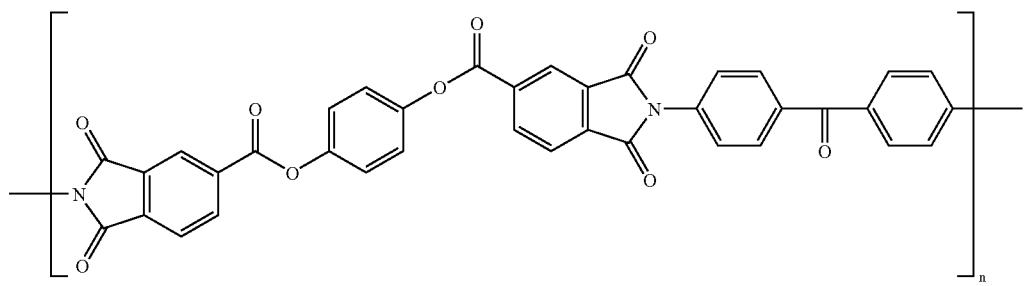

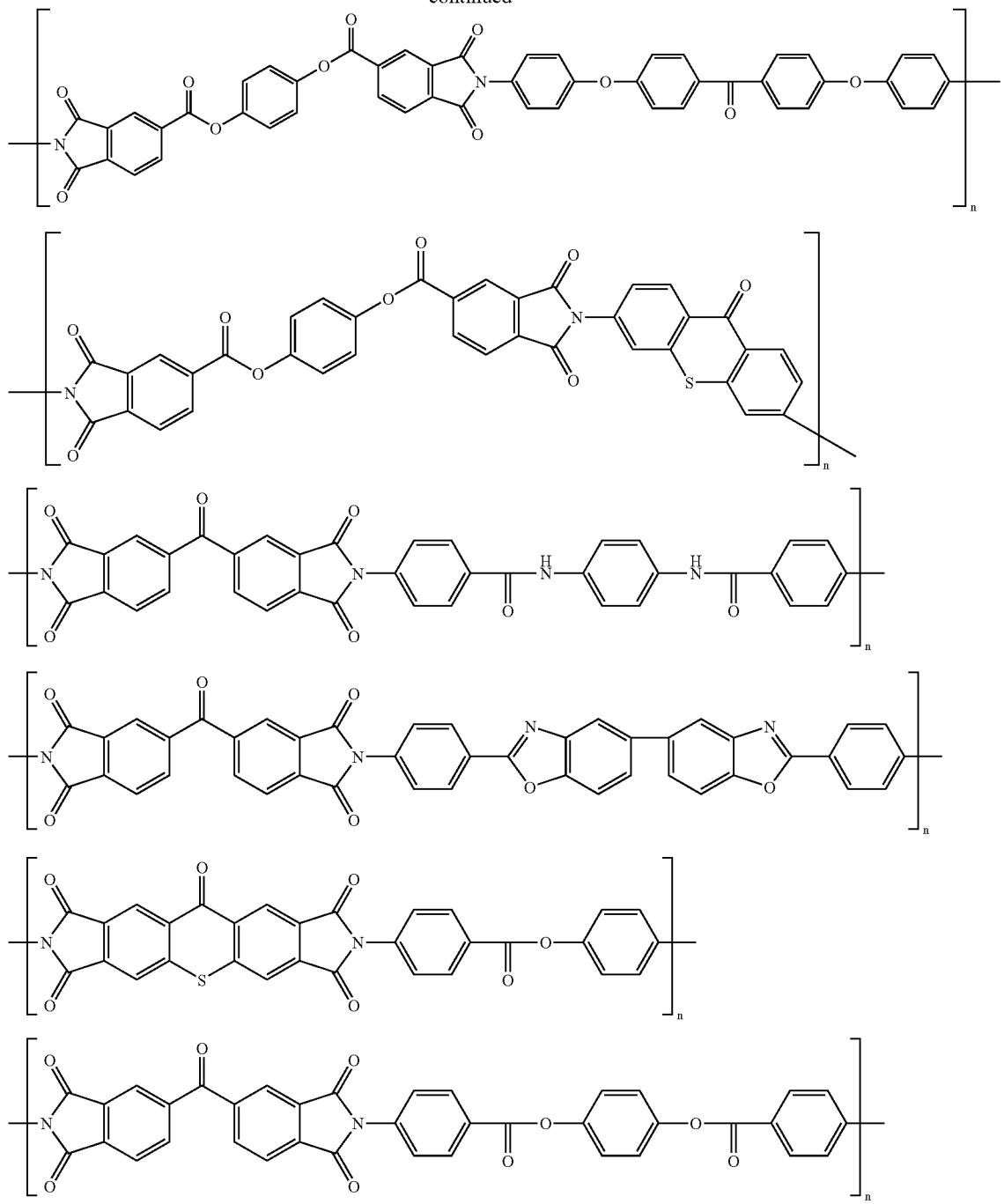

<2> Molding of Polyimide Precursor

Subsequent to the process <1>, the polyimide precursor is molded. As the polyimide precursor that is used in the invention, the compound represented by Formula (7) and obtained in <1> may be used alone, or in combination with a polyimide precursor having a different structure (compound including no group having the polymerization initiation property). When plurality kinds of polyimide precursors are used, the content ratio of the compound represented by Formula (7) and the plurality kinds of polyimide precursors included in the entire polyimide precursor is preferably in a range that the compound represented by Formula (7) being included in an amount of at least 50 mass %, and more preferably in an amount of at least 80 mass % relative to total amount of polyimide precursors.

There is no particular limitation to a shape of the molded polyimide precursor. However, a film shape or a plate shape is preferable in terms of manufacturing convenience.

Molding

As a method of the molding, any of biaxial stretching film molding, injection molding, extrusion molding, blow molding, compression molding, reaction molding, FRP molding, heat molding, roll sheet molding, calender molding, laminated molding and rotational molding can be applied. The polyimide precursor can be spread on a glass substrate or the like and dried to be thereby formed into a film shape.

<3> Change of Structure of Polyimide Precursor into Polyimide Structure by Heating Heating is conducted to the polyimide precursor molded in <2>. The heating is performed at about 100 to 450° C. for one minute to one hour, and the structure of the compound represented by Formula (7) (polyimide precursor) is thereby changed into the structure of the polyimide represented by the following Formula (22). Thus, the base material of the invention can be obtained.

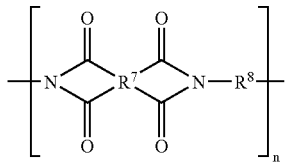

Formula (22)

$R^7$, $R^8$ and n in Formula (22) are similar to $R^7$, $R^8$ and n in Formula (I), and preferable ranges thereof are similar to those of $R^7$, $R^8$ and n in Formula (I), too.

Pattern Forming

In the pattern forming, the region where the polymer directly bonded to the base material surface and having the functional group that interacts with the electroless plating catalyst or the precursor thereof (hereinafter, the region where the graft polymer having the functional group that interacts with the electroless plating catalyst or the precursor thereof is generated in the pattern shape is referred to as an "interaction-property region") is generated in the pattern shape is formed on the surface of the polyimide base material obtained as described.

As described above, the preferred modes of the metallic pattern forming method according to the invention are the metallic pattern forming method (1) and the metallic pattern forming method (2). Hereinafter, the pattern forming in the pattern forming methods (1) and (2), namely, the formation of the interaction-property region, are described in detail.

Pattern Forming by Means of Metallic Pattern Forming Method (1)

In the pattern forming method (1), the polymer compound layer made of the polymer compound directly bonded to the base material surface and having the functional group whose chemical structure is changed so as to obtain or lose an ability to interact with either an electroless plating catalyst or a precursor thereof in response to heat, acid or radiation (hereinafter, referred to as a "pattern forming layer"), is provided on the surface of the base material including the specific polyimide according to the invention, and heat, acid or radiation is applied to the polymer compound in the pattern shape so that the pattern comprised of the region where the graft polymer directly bonded to the base material surface and having the functional group that interacts with the electroless plating catalyst or the precursor thereof is generated in the pattern shape (interaction-property region) according to the third mode is formed on the base material surface.

More specifically, in the present method, the pattern forming layer is formed by generating the polymer compound having the functional group whose chemical structure is changed so as to obtain or lose an ability to interact with either an electroless plating catalyst or a precursor thereof in response to heat, acid or radiation on the entire surface of the polyimide base material by means of the surface graft polymerization which will be described later. Thereafter, heat, acid or radiation is applied to the pattern forming layer in the pattern shape to thereby change the functional group that does not interact with the electroless plating catalyst or the precursor thereof into the structure that interacts with the electroless plating catalyst or the precursor thereof, or change the functional group that interacts with the electroless plating catalyst or the precursor thereof into the structure that does not interact with the electroless plating catalyst or the precursor thereof in the energy-applied part of the polymer compound. As a result, the pattern comprised of the hydrophilic and hydrophobic regions or the region where the graft polymer having the functional group that interacts with the electroless plating catalyst or the precursor thereof is generated in the pattern shape (interaction-property region) is formed.

Hereinafter, the "functional group whose structure is changed into the structure that interacts with the electroless plating catalyst or the precursor thereof in response to heat, acid or radiation" and the "functional group whose structure is changed into the structure that does not interact with the electroless plating catalyst or the precursor thereof in response to heat, acid or radiation" are appropriately referred to as a "polarity conversion group". Further, the group that interacts with the electroless plating catalyst or the precursor thereof is hereinafter referred as a hydrophilic group.

Surface Graft Polymerization

The pattern forming layer according to the pattern forming method (1) is formed by means generally called "surface graft polymerization". Graft polymerization is aa method an active species is provided on a chain of the polymer compound to thereby further polymerize another monomer initiating the polymerization so that the graft polymer is synthesized. When the polymer compound provided with the active species forms a solid surface, it is specifically called surface graft polymerization. In the invention, the surface of the base material ahving the specific polyimide is the solid surface described above. A photo-graft method, in which the energy is provided through photoirradiation, is preferably employed as the method of the surface graft polymerization.

Energy Application in Surface Graft Polymerization

Examples of the energy application means for generating the activation site in the polymerization initiating site which is present on the surface of the base material having the specific polyimide include heating or radiation such as light exposure. Specific examples thereof include photoirradiation using a UV lamp or a visible light beam, heating by means of a hot plate, and the like.

Examples of a light source which can be used in the invention include a mercury vapor lamp, a metallic halide lamp, a xenon lamp, a chemical lamp, a carbon arc light, and the like. As further choices, g rays, i rays and deep-UV light can also be used.

A length of time required for the energy application is generally between ten seconds and five hours, however, it may vary depending on a desired generation amount of the graft polymer and light source.

(A) Functional Groups Whose Hydrophilicity/Hydrophobicity is Changed in Response to Heat or Acid Firstly, the functional group whose hydrophilicity/hydrophobicity is changed in response to heat, acid or radiation is described. The functional groups whose hydrophilicity/hydrophobicity is changed in response to heat or acid includes are two kinds of the functional groups, namely (A-1) a hydrophobic functional group that changes into hydrophilic functional group and (A-2) a hydrophilic functional group that changes into hydrophobic functional group.

(A-1) Hydrophobic Functional Group that Changes into Hydrophilic Functional Group in Response to Heat or Acid Effective examples of the hydrophobic functional group changing into a hydrophilic functional group in response to heat or acid include conventionally-known functional groups described in references, such as alkylsulfonic acid esters, disulfones, and sulfoneimides described in Japanese Patent Application Laid-Open (JP-A) No. 10-282672, alkoxyalkyl esters described in European Patent No. 0652483 or WO92/9934, t-butyl esters described in "Macromolecules", vol. 21, pp. 1477 by H. Ito, carboxylic acid esters protected by an acid decomposable group such as silyl esters and vinyl esters as described in publications, and the like.

Further, iminosulfonate groups described in "Surface" vol. 133 (1995), pp. 374 by Masahiro Kadooka, β-ketone sulfonic acid esters described in "Polymer preprints, Japan" vol. 46 (1997), pp. 2045 by Masahiro Kadooka, and nitrobenzyl sulfonate compounds described in Japanese Patent Application Laid-Open (JP-A) No. 63-257750 can also be used. However, the invention is not limited to the mentioned functional groups.

Among these functional groups, a secondary alkylsulfonic acid ester group shown below, a tertiary carboxylic acid ester group, and an alkoxyalkyl ester group shown below are particularly superior.

Examples of the secondary alkylsulfonic acid ester group, which is particularly superior as the hydrophobic functional group changing into a hydrophilic functional group in response to heat or acid used in the invention, include the group represented by the following Formula (A).

Formula (A)

Each of $R^{101}$ and $R^{102}$ in Formula (A) independently represents a substituted or non-substituted alkyl group. Further, $R^{101}$ and $R^{102}$ may form a ring together with a secondary carbon atom (CH) to which $R^{101}$ and $R^{102}$ are bonded.

$R^{101}$ and $R^{102}$ in Formula (A) represents a substituted or non-substituted alkyl or substituted or non-substituted aryl group. Further, $R^{101}$ and $R^{102}$ may form a ring together with a secondary carbon atom (CH) to which $R^{101}$ and $R^{102}$ are bonded. When $R^{101}$ and $R^{102}$ represent a substituted or non-substituted alkyl group, examples of the alkyl group include a straight-chain, branched-chain or circular-chained alkyl group such as a methyl group, ethyl group, isopropyl group, tbutyl group and cyclohexyl group, and those which have 1 to 25 carbon atoms are favorably used. When $R^{101}$ and $R^{102}$ represent a substituted or non-substituted aryl group, examples of the aryl group include a carbocyclic aryl group and heterocyclic aryl group. As the carbocyclic aryl group, a phenyl group, naphthyl group, anthracenyl group, pyrenyl group or the like having 6 to 19 carbon atoms is used. As the heterocyclic aryl group, a pyridyl group, furyl group, quinolyl group in which benzene rings are condensed, benzofuryl group, thioxanthone group, carbazole group or the like having 3 to 20 carbon atoms and 1 to 5 heteroatoms is used.

When $R^{101}$ and $R^{102}$ represent a substituted alkyl group or substituted aryl group, examples of the substituted group include an alkoxy group having 1 to 10 carbon atoms such as a methoxy group or ethoxy group; a halogen atom such as a fluorine atom, chlorine atom or bromine atom; a halogen-substituted alkyl group such as a trifluoromethyl group or trichloromethyl group; an alkoxycarbonyl group or aryloxycarbonyl group having 2 to 15 carbon atoms such as a methoxycarbonyl group, ethoxycarbonyl group, t-butyloxycarbonyl group or p-chlorophenyloxycarbonyl group; a hydroxyl group; an acyloxy group such as acetyloxy, benzoyloxy and p-diphenylaminobenzoyloxy; a carbonate group such as a t-butyloxycarbonyloxy group; an ether group such as a t-butyloxycarbonylmethyloxy group or 2-pyranyloxy group; a substituted or non-substituted amino group such as an amino group, dimethylamino group, diphenylamino group, morpholino group or acetylamino group; a thioether group such as a methylthio group or phenylthio group; an alkenyl group such as a vinyl group or steryl group; a nitro group; a cyano group; an acyl group such as a formyl group, acetyl group or benzoyl group; an aryl group such as a phenyl group or naphtyl group; and a heteroaryl group such as pyridyl group, and the like. When $R^{101}$ and $R^{102}$ represent a substituted or non-substituted aryl group, an alkyl group such as a methyl group or ethyl group can also be used as the substituent in addition to the groups mentioned above.

As $R^{101}$ and $R^{102}$, the substituted or non-substituted alkyl group, which is superior in maintaining stability over time, is preferably used. More specifically, an alkyl group substituted by an electron withdrawing group such as an alkoxy group, carbonyl group, alkoxycarbonyl group, cyano group or halogen group, or an alkyl group such as a cyclohexyl group or norbornyl group are particularly preferable. In terms of a physical property value, a compound which exhibits a chemical shift of a secondary methine hydrogen in a proton NMR in a magnetic field range lower than 4.4 ppm in heavy chloroform is preferably used, and a compound which exhibits the chemical shift in a magnetic field range lower than 4.6 ppm is more preferably used. The presumed reason why the alkyl group substituted by the electron withdrawing group is preferable is that a carbocation, which appears to be generated as an intermediate agent at the time of a heat decomposing reaction, is made unstable by the electron withdrawing group, and the decomposition is thereby controlled. More specifically, the structures represented by the following formulas are particularly preferable for the structure of —$CHR^{101}R^{102}$.

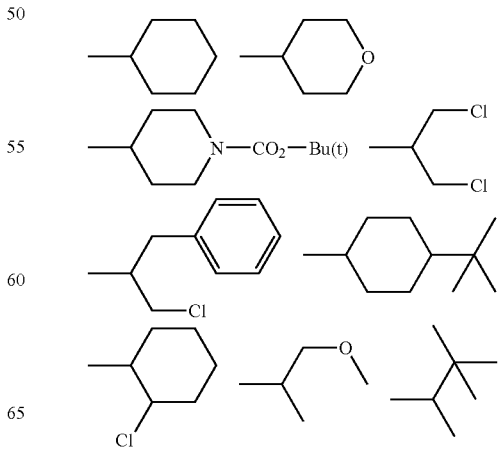

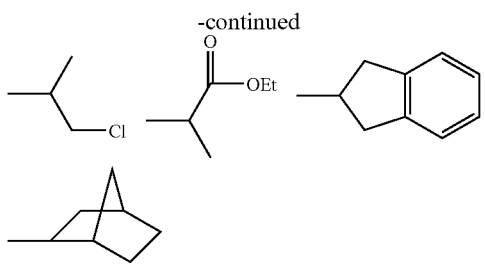

In the invention, an alkoxyalkyl ester group that is especially superior as the functional group whose hydrophobicity is changed to hydrophilicity in response to heat or acid is represented by the following Formula (B).

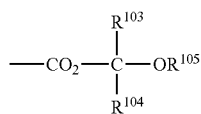

Formula (B)

In the Formula (B), $R^{103}$ represents a hydrogen atom, $R^{104}$ represents a hydrogen atom or an alkyl group having at most 18 carbon atoms, and $R^{105}$ represents an alkyl group having at most 18 carbon atoms. Further, two of $R^{103}$, $R^{104}$ and $R^{105}$ may be bonded with each other to thereby form a ring. In particular, it is preferable that $R^4$ and $R^5$ are bonded to thereby form a five- or six-member ring.

Among those described above, the secondary alkylsulfonic acid ester group represented by Formula (A) is particularly preferable as the hydrophobic functional group that changes into a hydrophilic functional group in response to heat or acid according to the invention. Specific examples of the functional groups represented by Formula (A) or (B) and the tertiary carboxylic acid ester group (functional groups (1) to (13)) are shown below.

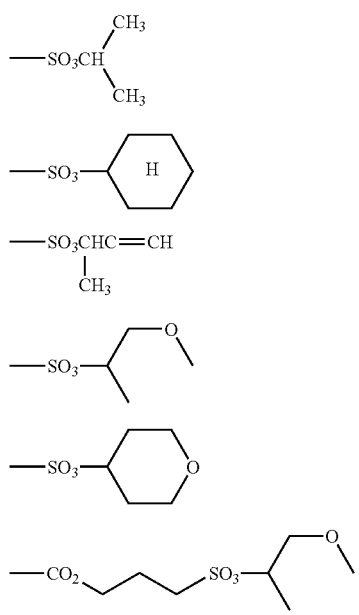

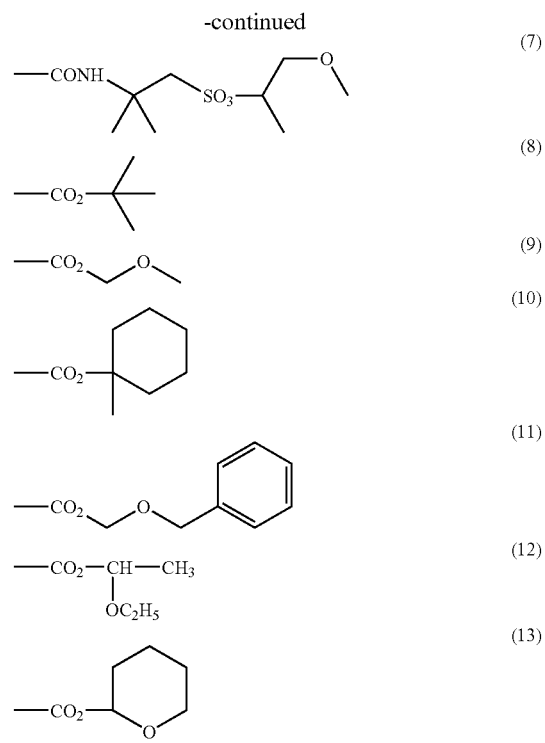

(A-2) Hydrophilic Functional Group that Changes into Hydrophobic Functional Group in Response to Heat or Acid Examples of the hydrophilic functional group that changes into a hydrophobic functional group in response to heat or acid according to the invention include polymers including an onium base, particularly polymers including an ammonium salt described in Japanese Patent Application Laid-Open (JP-A) No. 10-296895 and U.S. Pat. No. 6,190,830. Specific example thereof is (meta) acryloyloxyalkyltrimethyl ammonium and the like. Further, carboxylic acid groups and carboxylic acid bases represented by the following Formula (C) are also preferable examples. However, the invention is not limited to these mentioned examples.

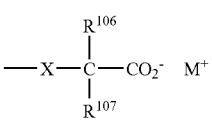

Formula (C)

In the Formula (C), X represents —O—, —S—, —Se—, —NR$^{108}$—, —CO—, —SO—, —SO$_2$—, PO—, SiR$^{108}$R$^{109}$—, or —CS—. each of $R^{106}$, $R^{107}$, $R^{108}$ and $R^{109}$ independently represents a monovalent group. M represenst an ion having a positive charge.

Specific examples of $R^{106}$, $R^{107}$, $R^{108}$ and $R^{109}$ include —F, —Cl, —Br, —I, —CN, —R$^{110}$, —OCOR$^{110}$, —OCOOR$^{110}$, —OCONR$^{110}$R$^{111}$, —OCO$_2$R$^{110}$, —COR$^{110}$, —COOR$^{110}$, —CONR$^{110}$R$^{111}$, —NR$^{110}$R$^{111}$, —NR$^{110}$—COR$^{111}$, —NR$^{110}$—COOR$^{111}$, —NR$^{110}$—CONR$^{111}$R$^{112}$, —SR$^{110}$, —SOR$^{110}$, —SO$_2$R$^{110}$, —SO$_3$R$^{110}$ and the like.

Each of $R^{110}$, $R^{111}$ and $R^{112}$ represents a hydrogen atom, an alkyl group, an aryl group, an alkenyl group or an alkynyl group.

More specifically, among those mentioned above, a hydrogen atom, an alkyl group, an aryl group, an alkynyl group and an alkenyl group are preferable for $R^{106}$, $R^{107}$, $R^{108}$ and $R^{109}$.

M+ represents an ion having a positive charge, and specific examples thereof include a sodium ion, a potassium ion, an ammonium ion, a lithium ion and the like, and further include a hydrogen ion.

Specific examples of the functional group represented by Formula (C), (functional groups (14) to (31)), are shown below.

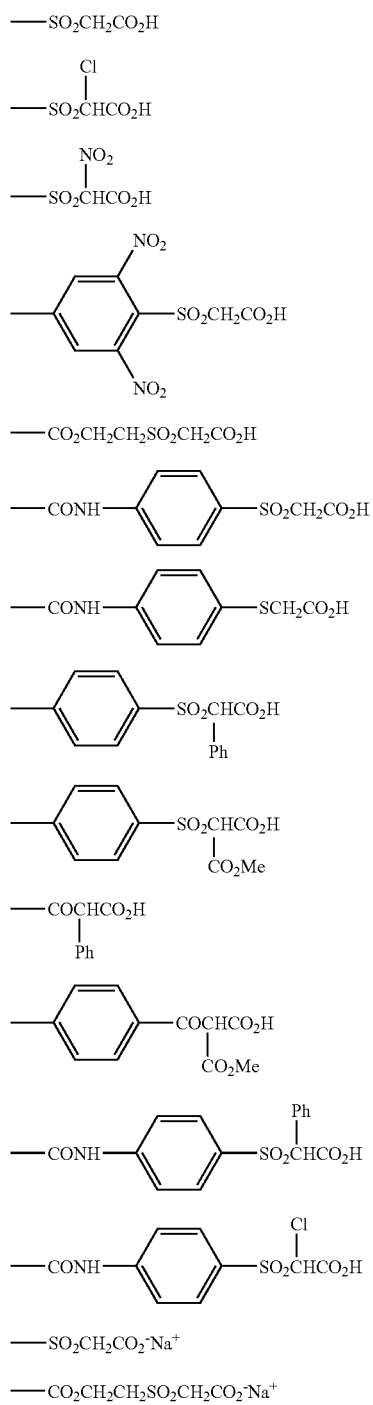

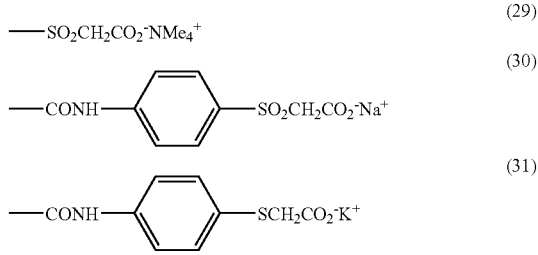

The polymer compound having the polarity conversion group according to the invention may be a homopolymer composed of a monomer or a copolymer composed of at least two monomers each having any of the above-mentioned functional groups. A copolymer including a monomer other than the monomers having any of the foregoing functional groups may be used as far as the effect of the invention is not undermined.

Specific examples of the monomer having any of the above-mentioned functional groups are shown below.

The following are specific examples of the monomer having any of the functional groups represented by Formulas (A) or (B) (exemplified monomers (M-1) to (M-15)).

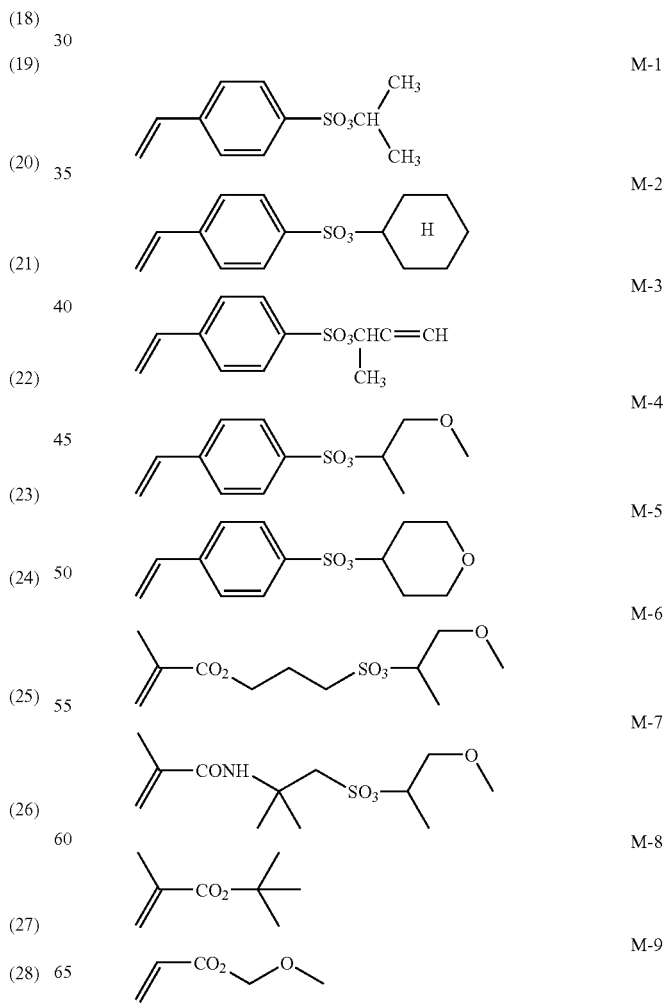

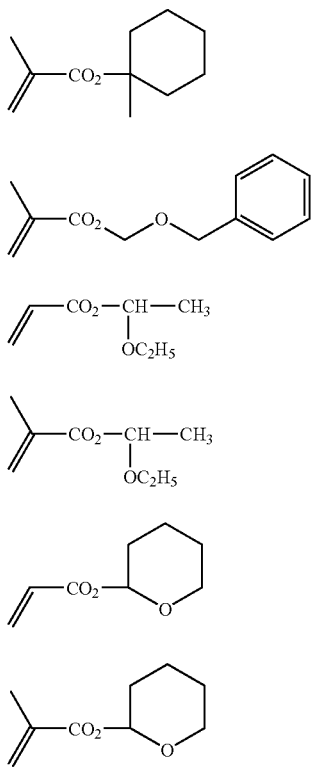

The following are specific examples of the monomer having the functional group represented by Formula (C) (exemplified monomers (M-16) to (M-33)).

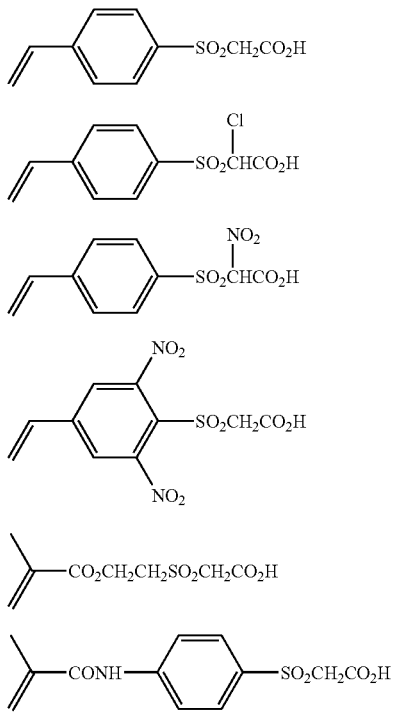

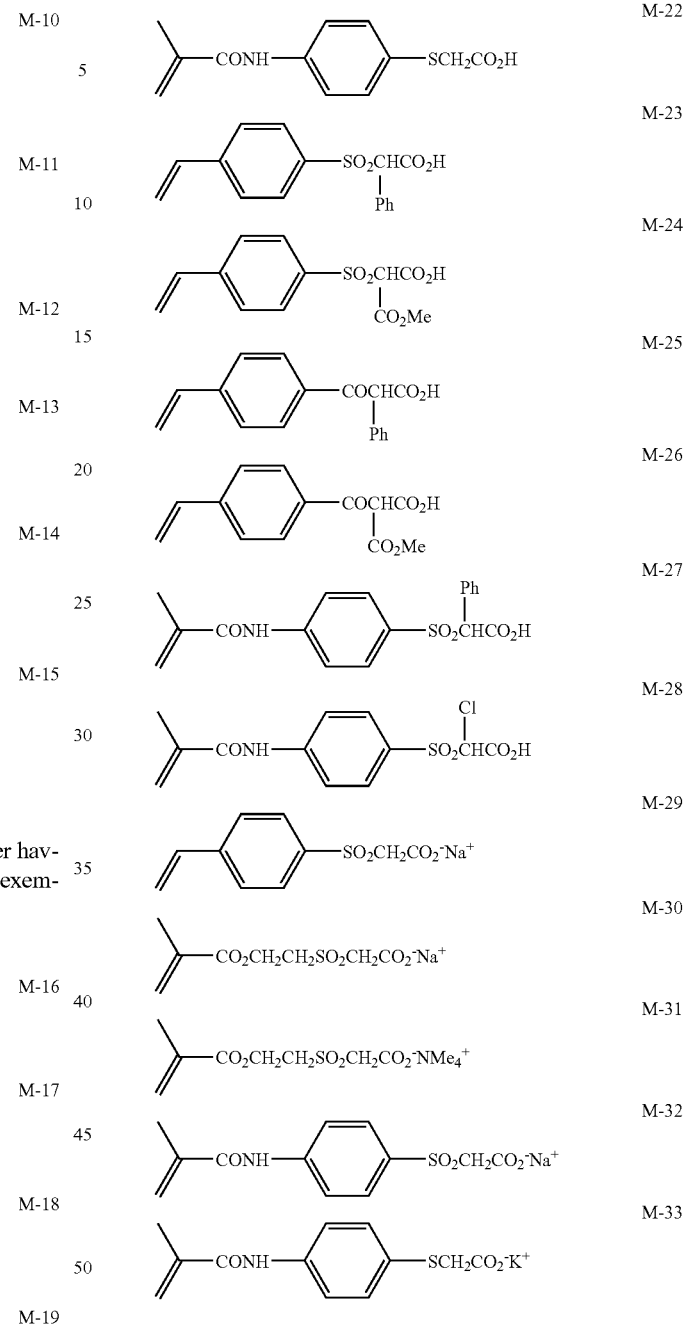

Photo-Thermal Converting Material

When a light energy such as IR laser is applied as the energy for forming hydrophilicity/hydrophobicity regions on the surface of the pattern forming material that uses the polymer compound having the polarity conversion group, a photo-thermal converting material for converting the light energy into a thermal energy is preferably included in the pattern forming material. The photo-thermal converting material may be included in the pattern forming layer or the base material, or may be included in a separately provided layer for including the photo-thermal converting material.

As the photo-thermal converting material usable in the invention, any substance can be used as long as it is capable of absorbing a UV light, visible light beam, infrared ray, white light or the like and converting them into heat. Examples thereof include carbon black, carbon graphite, pigments, phthalocyanine compound pigments, iron powder, black lead powder, purple powder, lead oxide, silver oxide, chrome oxide, iron sulfide, chrome sulfide, and the like. Particularly preferable examples thereof include dyes, pigments or metallic fine particles having a maximum absorption wavelength in the range of 760 nm to 1200 nm, which is a range of exposure wavelength of an infrared laser used for an energy application.

Examples of the dye include commercially available dyes and publicly known dyes described in documents (for example, "Dye Handbook" 1970 edition, edited by the Society of Synthetic Organic Chemistry, Japan). More specifically, examples of the dye include dyes such as azo dyes, metallic complex salt azo dyes, pyrazolone azo dyes, anthraquinone dyes, phthalocyanine dyes, carbonium dyes, quinoneimine dyes, methine dyes, cyanine dyes, or metallic thiolate complexes. Preferable examples of dyes include, for example: cyanine dyes described in JP-A 58-125246, 59-84356, 59-202829, 60-78787; methine dyes described in Publication of Japanese Patent Application Laid-Open (JP-A) Nos. 58-173696, 58-181690, 58-194595 and the like; naphthoquinone dyes described in JP-A No. 58-112793, 58-224793, 59-48187, 59-73996, 60-52940, No. 60-63744 and the like; squarylium dyes described in JP-A No. 58-112792 and the like; and cyanine dyes described in GB Patent No. 434,875, and the like.

Near infrared absorbing sensitizers described in U.S. Pat. No. 5,156,938 are also preferably used. Further, preferable examples of the infrared absorbing sensitizers include substituted arylbenzo (thio) pyrylium salts described in U.S. Pat. No. 3,881,924, trimethine thiopyrylium salts described in Japanese Patent Application Laid-Open (JP-A) No. 57-142645 (U.S. Pat. No. 4,327,169), pyrylium compounds described in JP-A Nos. 58-181051, 58-220143, 59-41363, 59-84248, 59-84249, 59-146063, and 59-146061, cyanine dyes described in JP-A No. 59-216146, pentamethine thiopyrylium salts described in U.S. Pat. No. 4,283,475, pyrylium compounds described in JP-B Nos. 5-13514 and 5-19702, and the like. As another preferable example of the dye, near infrared absorbing dyes represented by either Formulas (I) or (II) described in the specification of U.S. Pat. No. 4,756,993 can also be mentioned. Particularly preferable examples thereof include the dyes, cyanine dyes, squarylium dyes, pyrylium salts, and nickel thiolate complexes.

Examples of the usable pigments include commercially available pigments and pigments described in: the Color Index (C. I.) Handbook, "*Latest Pigments Handbook*", 1977 edition, edited by the Society of Pigment Technology, Japan; "*Latest Applied Technology of Pigment*", 1986 edition, published by CMC; and/or "*Printing Ink Technology*", 1984 edition, published by CMC. Examples of kinds of the pigments include black pigments, yellow pigments, orange pigments, brown pigments, red pigments, purple pigments, blue pigments, green pigments, fluorescent pigments, metallic powder pigments, and polymerbound dye. Specific examples of usable pigments include insoluble azo pigments, azo lake pigments, condensed azo pigments, chelate azo pigments, phthalocyanine compound pigments, anthraquinone compound pigments, perylene compound pigments, perinone compound pigments, thioindigo compound pigments, quinacridone compound pigments, dioxazine compound pigments, isoindolinone compound pigments, quinophthalone compound pigments, dyeing lake pigments, azine pigments, nitroso pigments, nitro pigments, natural pigments, fluorescent pigments, inorganic pigments, carbon black, and the like. Among the mentioned pigments, carbon black is preferably used.

Examples of the usable metallic fine particle include a metallic fine particles composed of Au, Ag, Pt, Cu, Ni, Zn, Pd, Cr, Fe, Pb or the like, or a metallic fine particles composed of an oxide or sulfide of any of these metals. Specific examples thereof include iron powder, black lead powder, purple powder, lead oxide, silver oxide, chrome oxide, iron sulfide, chrome sulfide and the like.

When the photo-thermal converting material is used in the invention, in view of the sensitivity, a ratio of an amount of the photo-thermal converting material is preferably 0.01 to 50 mass %, and more preferably 0.1 to 10 mass %, relative to the total solid content of the layer including the photo-thermal converting material. When a dye is used as the photo-thermal converting material, a preferable ratio of an amount of the dye is 0.5 to 10 mass % relative to the total solid content of the layer including the dye. When a pigment is used as the photo-thermal converting material, a preferable ratio of an amount of the pigment is 3.1 to 10 mass % relative to the total solid content of the layer including the pigment. When a metallic fine particle is used as the photo-thermal converting material, a preferable ratio of an amount of the metallic fine particle is 0.01 to 50 mass %, and more preferably 0.1 to 30 mass %, relative to the total solid content of the layer including the metallic fine particle.

Acid Generating Substance

As a method for imparting an acid to the pattern forming layer (polymer layer) formed on the base material by means of the surface graft polymerization described above in order to convert the polarity, an acid generating substance may be included in the pattern forming layer, or the acid generating substance may be included in a layer separately provided for including the acid generating substance.

As the acid generating substance, a compound which generates an acid in response to heat or light is used. In general, examples thereof include a light initiating agent for photocation polymerization, a light initiating agent for photo-radical polymerization, a photo-bleaching agent or photo-color changing agent for dyes, a conventionally-known compound that generates acid by means of light which is used for a microresist or the like, a mixture of the above-mentioned substances, and the like. An appropriate substance can be selected from the above-mentioned and used.

Examples of the acid generating substance include: diazonium salts described in S. I. Schlesinger, *Photogr Sci. Eng.*, 18, 387 (1974), T. S., Bal et al., *Polymer,* 21, 423 (1980) or the like; ammonium salts described in JP-A No. 3-140140 or the like; phosphonium salts described in U.S. Pat. No. 4,069,055 or the like; iodonium salts described in JP-A Nos. 2-150848, 2-296514 or the like; sulfonium salts described in J. V. Crivello et al., *Polymer J.* 17, 73 (1985), U.S. Pat. No. 3,902,114, EP Patent Nos. 233,567, 297,443 or 297,442, U.S. Pat. Nos. 4,933,377, 4,491,628, 5,041,358, 4,760,013, 4,734,444, or 2,833,827, and DE Patent Nos. 2,904,626, 3,604,580, or 3,604,581;

selenonium salts described in J. V. Crivello et al., *Macromolecules,* 10 (6), 1307 (1977) or the like; onium salts such as arsonium salts described in C. S. Wen et al., Teh, *Proc. Conf. Rad. Curing ASIA*, pp. 478, Tokyo, October (1988) or the like; organic halogen compounds described in JP-A No. 63-298339 or the like; organic metal/organic halogen compounds described in JP-A No. 2-161445 or the like; photo acid-generating agents having an o-nitrobenzyl protecting group described in S. Hayase et. at., *J. Polymer Sci.,* 25, 753

(1987), JP-A Nos. 60-198538, 53-133022 or the like; compounds generating sulfonic acid through photo-decomposition, typical examples thereof include iminosulfonates and the like described in JP-A Nos. 64-18143, 2-245756 and 3-140109; and disulfone compounds described in JP-A No. 61-166544 or the like.

The acid generating substance can be used at a ratio of 0.01 to 100 mass %, and preferably at a ratio of 10 to 100 mass %, relative to the total solid component of the layer including the acid generating substance from the standpoint of sensitivity.

(B) Functional Group Whose Hydrophilicity/Hydrophobicity is Changed in Response to Light In some of the functional groups whose polarity is changed, the polarity is changed in response to photoirradiation of at most 700 nm. The (B) functional group whose polarity is changed in response to light (polarity conversion group: polarity conversion group reacting to light of at most 700 nm) is characterized in that the polarity thereof is changed at a high sensitivity because decomposition, ring opening or a dimerizing reaction is generated, not through long wavelength exposure using infrared rays or the like, but directly through the photoirradiation of a predetermined wavelength. The functional group whose polarity is changed in response to photoirradiation of at most 700 nm is described below.

There are two kinds of the (B) functional group whose polarity is changed in response to light: (B-1) a hydrophobic functional group that changes into a hydrophilic functional group in response to light; and (B-2) a hydrophilic functional group that changes into a hydrophobic functional group in response to light.

(B-1) Hydrophobic Functional Group that Changes into Hydrophilic Functional Group in Response to Light Examples of the (B-1) hydrophobic functional group that changes into a hydrophilic group in response to light include the functional groups represented by the following Formulas (I) to (VII) can be used.

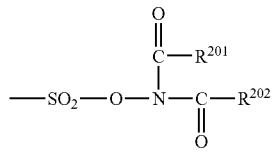
(I)

$R^{201}$ and $R^{202}$ in Formula (I) each independently represent an alkyl group or an aromatic ring group. $R^{201}$ and $R^{202}$ may be bonded to each other to thereby form a ring.

The alkyl group represented by $R^{201}$ and $R^{202}$ preferably has 1 to 8 carbon atoms, and examples thereof include a methyl group, ethyl group, propyl group, butyl group, pentyl group, hexyl group, heptyl group, octyl group, isopropyl group, isobutyl group, s-butyl group, t-butyl group, cyclohexyl group, isopentyl group, neopentyl group, 1-methylbutyl group, isohexyl group, 2-ethylhexyl group, 2-methylhexyl group, cyclopentyl group and the like. $R^{201}$ and $R^{202}$ may be bonded with each other via a unit of —$(CH_2)_n$—, in which n is an integer from 1 to 4.

Among the mentioned examples, $R^{201}$ and $R^{202}$ preferably constitute a ring structure in which they are bonded with each other via a unit of —$(CH_2)_n$—, in which n is an integer from 1 to 4.

The alkyl group represented by $R^{201}$ and $R^{202}$ may be substituted or non-substituted, and example of a substituent to be introduced include monovalent non-metal atomic groups excluding a hydrogen. Preferable examples thereof include a halogen atom such as F, Br, Cl or I, a hydroxyl group, an alkoxy group, an amino group, a formyl group, an acyl group, a carboxyl group, an alkoxycarbonyl group, an aryloxycarbonyl group, a carbamoyl group, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group and the like.

The aromatic ring group represented by $R^{201}$ and $R^{202}$ preferably has 6 to 14 carbon atoms, and examples thereof include a phenyl group, biphenyl group, naphthyl group, and mesityl group. Among the mentioned examples, the phenyl group and naphthyl group are preferably used.

Further, the aromatic ring group represented by $R^{201}$ and $R^{202}$ may be substituted or non-substituted, and examples of a substituent to be introduced include monovalent non-metal atomic groups excluding hydrogen is used. Preferable examples thereof include a halogen atom such as F, Br, Cl or I, a hydroxyl group, alkoxy group, amino group, formyl group, acyl group, carboxyl group, alkoxycarbonyl group, aryloxycarbonyl group and the like.

More specific and particularly preferable examples of $R^{201}$ and $R^{202}$ include those having a structure, a terminal structure thereof including a bonding carbonyl group and a nitrogen atom bonded to the carbonyl group of which are represented by the following formulas.

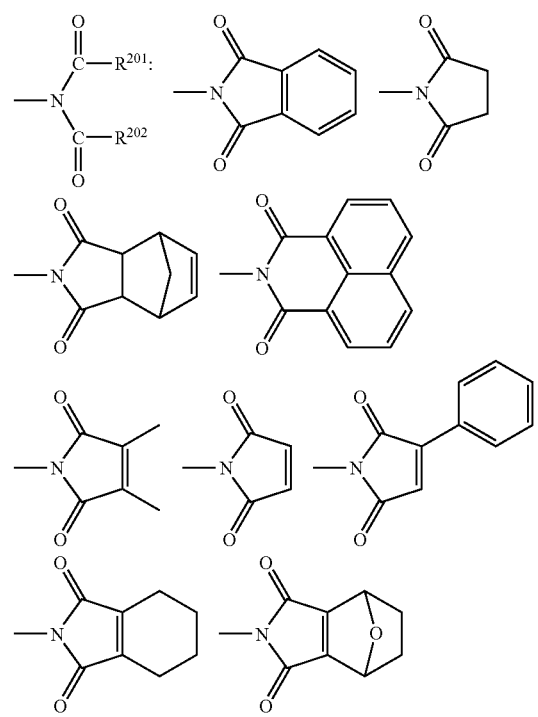

In the invention, example of the hydrophobic functional group that changes into a hydrophilic group in response to light can be represented by the following Formula (II).

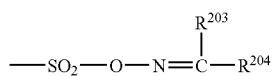

(II)

$R^{203}$ and $R^{204}$ in Formula (II) each independently represent a univalent substituent group. $R^{203}$ and $R^{204}$ may be bonded to each other to thereby form a ring.

$R^{203}$ and $R^{204}$ in Formula (II) each independently represent a monovalent substituent group, and more specifically represent an alkyl group, hydroxyl group, alkoxy group, amino group, formyl group, acyl group, carboxyl group, cyano group or aromatic ring group.

When each of $R^{203}$ and $R^{201}$ is akyl groups, it is preferable that the number of carbon atoms included therein is in the range of 1 to 8. Specific examples thereof include a methyl group, ethyl group, propyl group, butyl group, pentyl group, hexyl group, heptyl group, octyl group, isopropyl group, isobutyl group, s-butyl group, tbutyl group, isopentyl group, neopentyl group, 1-methylbutyl group, isohexyl group, 2-ethylhexyl group, 2-methylhexyl group, cyclopentyl group and the like. $R^{203}$ and $R^{204}$ may be bonded with each other via the unit of $—(CH_2)_n—$, in which n is an integer from 1 to 4.

Among these examples, $R^{203}$ and $R^{204}$ are preferably the methyl group, the ring structure in which they are bonded with each other via the unit of $—(CH_2)_n—$, in which n is an integer from 1 to 4.

The alkyl group, hydroxyl group, alkoxy group, amino group, formyl group, acyl group, carboxyl group or cyano group represented by $R^{203}$ and $R^{204}$ may be substituted or non-substituted. Examples of a substituent group introduced thereto include monovalent non-metal atomic groups except for a hydrogen atom. Preferable examples thereof include a halogen atom such as F, Br, Cl or I, a hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

It is preferable that the aromatic ring group represented by $R^{203}$ and $R^{204}$ has 6 to 14 carbon atoms, examples of which include a phenyl group, biphenyl group, naphthyl group and mesityl group. Among the mentioned examples, a phenyl group and naphthyl group are preferably used.

The aromatic ring group represented by $R^{203}$ and $R^{204}$ may be substituted or non-substituted. Examples of a substituent group introduced thereto include monovalent non-metal atomic groups except for a hydrogen atom. Preferable examples thereof include a halogen atom such as F, Br, Cl or I, a hydroxyl group, alkoxy group, amino group, formyl group, acyl group, carboxyl group, alkoxycarbonyl group, aryloxycarbonyl group and the like.

It is more preferable that $R^{203}$ and $R^{204}$ are aromatic ring group(s), which may be substituted or non-substituted and has at least a nitro group and 6 to 14 carbon atoms.

More specific and particularly preferable examples of $R^{203}$ and $R^{204}$ include those having a structure at a terminal thereof including $(—N=C)$ in Formula (II), which are represented by the following formulas.

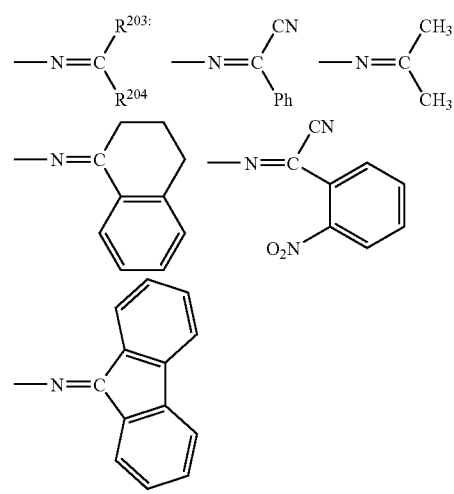

In the invention, examples of the hydrophobic functional group that changes into a hydrophilic group in response to light includes those represented by the following Formula (III).

(III)

In Formula (III), $R^{205}$ and $R^{206}$ each independently represent an alkyl group or aromatic ring group.

Preferable examples of the alkyl group represented by $R^{205}$ and $R^{206}$ include a straight-chain alkyl group having 1 to 25 carbon atoms such as a methyl group, ethyl group, propyl group, butyl group or pentyl group, and a branched-chain alkyl group having 1 to 8 carbon atoms such as isopropyl group, t-butyl group, s-butyl group, isopentyl group or neopentyl group. Among the mentioned examples, the methyl group, ethyl group, isopropyl group and t-butyl group are more preferably used.

The alkyl group represented by $R^{205}$ and $R^{206}$ may be substituted or non-substituted. Examples of a substituent group introduced thereto include monovalent non-metal atomic groups except for a hydrogen atom. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

The aromatic ring group represented by $R^{205}$ and $R^{206}$ includes a carbocyclic aromatic ring group and a heterocyclic aromatic ring group. The carbocyclic aromatic ring group preferably has 6 to 19 carbon atoms, and among them, a phenyl group, naphthyl group, acetolacenyl group, pyrenyl group, biphenyl group, xylyl group, mesityl group or the like including 1 to 4 benzene rings are more preferable. The heterocyclic aromatic ring group preferably has 3 to 20 carbon atoms and includes 1 to 5 heteroatoms, and among them, a pyridyl group, furyl group, quinolyl group in which benzene rings are condensed, benzofuryl group, thioxanthone group, carbozole group and the like are more preferable.

The aromatic ring group represented by $R^{205}$ and $R^{206}$ may be substituted or non-substituted. Examples of a substituent group introduced thereto include monovalent non-metal atomic groups except for a hydrogen atom. Preferable examples thereof include a halogen atom such as F, Br, Cl or I, hydroxyl group, alkoxy group, amino group, formyl group, acyl group, carboxyl group, alkoxycarbonyl group, aryloxycarbonyl group and the like.

The hydrophobic functional group that changes into a hydrophilic group in response to light can be represented by Formula (IV).

$$-SO_2-R^{207} \quad (IV)$$

$R^{207}$ in Formula (IV) represents an alkyl group or aromatic ring group.

The alkyl group represented by $R^{207}$ preferably has 1 to 8 carbon atoms, and examples thereof include a methyl group, ethyl group, propyl group, butyl group, pentyl group, hexyl group, heptyl group, octyl group, isopropyl group, isobutyl group, s-butyl group, t-butyl group, isopentyl group, neopentyl group, 1-methylbutyl group, isohexyl group, 2-ethylhexyl group, 2-methylhexyl group and cyclopentyl group.

The alkyl group represented by $R^{207}$ may be substituted or non-substituted. Examples of a substituent group introduced thereto include monovalent non-metal atomic groups except for a hydrogen atom. Preferable examples thereof include a halogen atom such as F, Br, Cl or I, hydroxyl group, alkoxy group, amino group, formyl group, acyl group, carboxyl group, alkoxycarbonyl group, aryloxycarbonyl group, carbamoyl group, phenyl group, biphenyl group, naphthyl group, tolyl group, xylyl group, mesityl group, cumenyl group, chlorophenyl group, bromophenyl group, chloromethylphenyl group, hydroxyphenyl group, methoxyphenyl group, ethoxyphenyl group, phenoxyphenyl group, acetoxyphenyl group and the like.

The aromatic ring group represented by $R^{207}$ preferably has 6 to 14 carbon atoms, and examples thereof include a phenyl group, biphenyl group, naphthyl group or mesityl group may be used. Among the mentioned examples, the phenyl group and naphtyl group.

The aromatic ring group represented by $R^{207}$ may be substituted or non-substituted. Examples of a substituent group introduced thereto include monovalent non-metal atomic groups except for a hydrogen atom. Preferable examples thereof include a halogen atom such as F, Br, Cl or I, hydroxyl group, alkoxy group, amino group, formyl group, acyl group, carboxyl group, alkoxycarbonyl group, aryloxycarbonyl group and the like.

More specific example of $R^{207}$, include structures represented by any one of the following formulas.

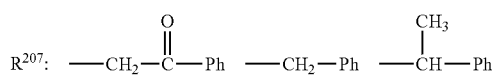

Examples of the polarity conversion group according to the invention further includes conventionally-known functional groups described in documents of related art, which are represented by any one of the following Formulas (V) to (VII).

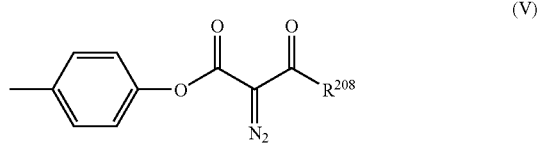

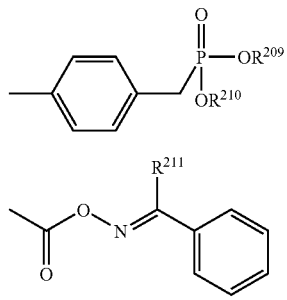

Formula (V) represents a group included in a quinonediazide polymer described on p. 2195 of "SPIE" (1994) by P. Jagannathan. In Formula (V), $R^{208}$ represents a straight-chain, branched-chain or circular alkyl group having 1 to 18 carbon atoms, aralkyl group having 7 to 12 carbon atoms, alkenyl group having 2 to 8 carbon atoms, alkynyl group having 2 to 8 carbon atoms, aromatic group having 6 to 18 carbon atoms, or group including aromatic groups mutually bonded by a cross-linking agent. These groups may further contain a substituent group.

Formula (VI) represents a group included in a phosphonic acid polymer described on p. 110 of "*Macromol*" (1995) by M. L. Schilling. In Formula (VI), $R^{209}$ and $R^{210}$ each independently represent an alkyl group having 1 to 5 carbon atoms.

Formula (VII) represents a group included in a polymer including an oximester group described on p. 2181 of "*J. Polym. Sci., Chem. Ed.*", (1996) by M. Tsunooka. In Formula (VII), $R^{211}$ represents straight-chain, branched-chain or cyclic alkyl group having 1 to 18 carbon atoms, aralkyl group having 7 to 12 carbon atoms, alkenyl group having 2 to 8 carbon atoms, alkynyl group having 2 to 8 carbon atoms, aromatic group having 6 to 18 carbon atoms, or group including aromatic groups mutually bonded by a cross-linking agent. These groups may further contain a substituent group.

(B-2) Hydrophilic Functional Group that Changs into Hydrophobic Functional Group in Response to Light Examples of the (B-2) hydrophilic functional group which changes into a hydrophobic group in response to light include a bispyridinioethylene group.

The polymer compound having the functional group whose polarity is changed in response to light according to the invention may be a homopolymer using a monomer having any of the above-described functional groups or a copolymer composed of at least two different monomers. The polymer compound may be a copolymer combining the above-mentioned monomer and any other monomer provided that the effect of the invention is diminished. Further, the polymer compound having any of the functional groups may be reacted with a graft polymer and thereby introduced.

Pattern Writing

The pattern-shape writing according to the present mode is performed through the irradiation of radiation such as light, application of acid or heating. Examples of the mode utilizing photoirradiation include the pattern forming by heating using scanning exposure with a laser beam in the infrared range or the like in the case of concomitantly using the photo-thermal converting material.

Examples of the method employed for the pattern forming include conducting the writing by heating, application of acid, or irradiation such as exposure. For example, photoirradiation by means of an infrared-ray laser, UV-ray lamp, visible light beam or the like, thermal recording by means of a thermal head, and the like, are possible. Examples of a light source of the above-described means include a cold cathode lantern, metal halide lamp, xenon lamp, chemical lamp, carbon ark light and the like. As the radiation, infrared rays can be used. Further, g rays and i rays are also usable.

Specific and preferable examples of generally adopted methods include direct image-wise recording by means of a thermal head or the like, scanning exposure by means of an infrared-ray laser, high-illuminance flash exposure by means of a xenon discharge lamp, exposure using an infrared-ray lamp, exposure using a UV-light lamp and the like.

When the polarity conversion group that reacts to light of at most 700 nm is used, the polarity is converted in the pattern forming layer. More specifically, any photoirradiation means capable of decomposing, ring-opening or dimerizing the polarity conversion group to thereby change the hydrophilicity/hydrophobicity can be used. For example, the photoirradiation using the UV-light lamp, visible light beam or the like is applicable, and examples of a light source thereof include a cold cathode lantern, a metal halide lamp, a xenon lamp, a chemical lamp, a carbon ark light and the like.

In order to implement direct pattern forming using digital data of a computer, the polarity is preferably converted by means of laser exposure. Examples of a usable laser include a gas laser such as a carbonate gas laser, nitrogen laser, Ar laser, He/Ne laser, He/Cd laser or Kr laser, a solid laser such as a liquid (dye) laser, ruby laser or Nd/YAG laser, a semiconductor laser such as a GaAs/GaAlAs or InGaAs laser, and an excimer laser such as a KrF laser, XeCl laser, XeF laser or $Ar_2$.

Pattern Forming by Means of Metallic Pattern Forming Method (2)

In the metallic pattern forming method (2), the compound having the polymerizable functional group and the functional group that interacts with the electroless plating catalyst or the precursor thereof are made to contact the surface of the base material including the polyimide including the polymerization initiating site in the skeleton thereof and subjected to irradiation in the pattern shape so as to generate the graft polymer on the base material surface in the pattern shape so that the pattern-shaped region that interacts with the electroless plating catalyst or the precursor thereof (interaction-property region) is formed.

The base material used in the present mode includes the polyimide including the polymerization initiating site in the skeleton thereof as described above.

In the description below, the "compound having the polymerizable functional group and the functional group that interacts with the electroless plating catalyst or the precursor thereof" is sometimes referred to as the "polymerizable compound having the interaction-property group" for conciseness.

Formation of Interaction-Property Region in Pattern Shape by Means of Surface Graft In the metallic pattern forming method (2), the polymerizable compound having the interaction-property group is made to contact to the polyimide base material surface and subjected to the energy application so that the polymerizable group of the compound and the polyimide base material are chemically bonded to each other. As a result, the region that interacts with the electroless plating catalyst or the precursor thereof (namely, an interaction-property region) can be formed in the pattern shape.

The above-mentioned contact may be conducted by dipping the base material in a liquid composition including the compound including the interaction-property group. However, in terms of easy handling and manufacturing efficiency, a layer whose main component is the composition including the compound including the interaction-property group is preferably formed on the base material surface through a coating process, which will be described later.

The formation of the surface graft through the energy application is described below.

The region where the graft polymer is generated and the interaction-property region are formed by means of a method called surface graft polymerization. In the graft polymerization, energy is applied to the chain of the polymer compound through a publicly known method using light, heat, electron ray or the like so that the active species is provided thereon to thereby further polymerize another polymerizable compound initiating the polymerization and thereby synthesize the graft polymer. When the polymer compound provided with the active species forms a solid surface, it is specifically called surface graft polymerization. In the invention, the surface of the base material having polyimide is the solid surface.

In the present mode, because the polyimide that constitutes the base material includes the polymerization initiating site in the skeleton thereof, the activation site can be easily formed with low energy. Therefore, the interaction-property region can be easily and simply formed in the pattern shape on the base material surface.

Among the methods of forming the surface graft, the photo-graft method in which the energy is applied through photoirradiation is preferably employed.

Polymerizable Compound Having the Interaction-Property Group

The polymerizable compound having the interaction-property group refers to a polymer in which an ethylene addition-polymerizable unsaturated group (polymerizable group) such as a vinyl group, allyl group or (meta) acrylic group is introduced as a polymerizable group into a monomer having the interaction-property group and described below or into a homopolymer and/or copolymer obtained by using at least one of the monomers having the interaction-property group. The polymer has the polymerizable functional group at least at a terminal or side chain thereof. The polymer having the polymerizable functional group at the terminal thereof is preferable, and the polymer having the polymerizable functional group at the terminal and at a side chain thereof is particularly preferable.

Examples of Monomers

Examples of the monomers having the interaction-property group include a (meth)acrylic acid or an alkali metal salt or amine salt thereof, an itaconic acid, an alkali metal salt and amine salt thereof, a styrene sulfonic acid salt, and the like. Specific examples thereof include 2-hydroxyethyl (meth) acrylate, (meth)acrylamide, N-monomethylol (meth)acrylamide, N-dimethylol (meth)acrylamide, arylamine or hydrohalic acid salt thereof, 3-vinylpropionic acid, an alkali metal salt and amine salt thereof, vinylsulfonic acid, an alkali metal salt and amine salt thereof, 2-sulfoethyl(meth)acrylate, polyoxyethylene glycol mono(meth)acrylate, 2-acrylamide-2-methylpropane sulfonic acid, acid phosphooxypolyoxyethyleneglycol mono(meth)acrylate, N-vinylpyrrolidone (having the following structure), sodium styrene sulfonate, vinyl benzoate or the like can be used. In general, a monomer including a functional group such as a carboxyl group, sulfonic acid group, phosphorous acid group, amino group, hydroxyl group, amide group, phosphine group, imidazole group, pyridine group or ether group (or salts thereof when a salt structure can be formed) can be used. In summary, monomers including a functional group such as a carboxyl group, sulfonic acid group, phosphorous acid group, amino group or salts thereof, hydroxyl group, amide group, phosphine group, imidazole group, pyridine group or salts thereof, or ether group can be used.

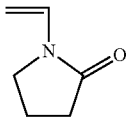

The polymerizable compound having the interaction-property group can be synthesized as follows.

Examples of the synthesizing methods include i) a method in which a monomer having the interaction-property group and a monomer having the polymerizable group are copolymerized, ii) a method in which the monomer having the interaction-property group and a monomer having a double-bond precursor are copolymerized and then treated with a base or the like to introduce a double bond, and iii) a method in which the monomer having the interaction-property group and the monomer having the polymerizable group are reacted with each other to thereby introduce a double bond (the polymerizable group). Among these methods, ii) the method in which the monomer having the interaction-property group and the monomer having the double-bond precursor are copolymerized and then treated with a base or the like to introduce a double bond, and iii) the method in which the monomer having the interaction-property group and the monomer having the polymerizable group are reacted with each other to thereby introduce the polymerizable group are preferably employed in terms of a synthetic aptitude.

Specific examples of the monomer used for synthesizing the polymerizable compound having the interaction-property group include (meta) acrylic acid, alkali metal salts and amine salts thereof, itaconic acid, alkali metal salts and amine salts thereof, 2-hydroxyethyl (meta) acrylate, (meta) acrylamide, N-monomethylol (meta) acrylamide, N-dimethylol (meta) acrylamide, allylamine or hydrohalic acid salt thereof, 3-vinylpropionic acid, alkali metal salts and amine salts thereof, vinylsulfonic acid, alkali metal salts and amine salts thereof, 2-sulfoethyl (meta) acrylate, polyoxyethyleneglycol mono (meta) acrylate, 2-acrylamide-2-methylpropane sulfonic acid, acidphosphooxypolyoxyethyleneglycol mono(meta) acrylate, and N-vinylpyrrolidone (having the following structure) In general, monomers having a functional group such as a carboxyl group, sulfonic acid group, phosphorous acid group, amino group, hydroxyl group, amide group, phosphine group, imidazole group, pyridine group or ether group (or salts thereof when a salt structure can be formed thereby) can be used.

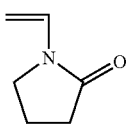

Examples of the monomer having the polymerizable group that can be copolymerized with the monomer having the interaction-property group include allyl (meta) acrylate and 2-allyloxyethyl methacrylate.

Examples of the monomer having the double-bond precursor include 2-(3-chloro-1-oxopropoxy) ethylmethacrylate and compounds described in Japanese Patent Application Laid-Open (JP-A) No. 2003-335814 as compounds (i-1 to i-60). These monomers, the following compound (i-1) is preferably used.

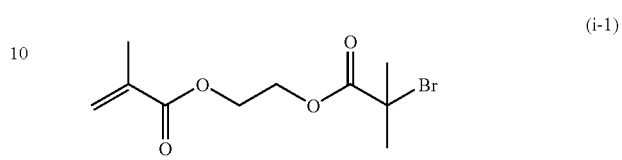

(i-1)

Examples of the monomer having the polymerizable group, which is used to introduce the unsaturated group utilizing the reaction with the functional group such as a carboxyl group or amino group or salt thereof, hydroxyl group, epoxy group or the like in the polymer having the hydrophilic group or interaction-property group, include (meta) acrylic acid, glycidyl (meta) acrylate, allylglycidyl ether, 2-isocyanatether (meta) acrylate and the like.

Next, iii) the method in which the monomer having the interaction-property group and the monomer having the double-bond precursor are copolymerized and treated with the base or the like to introduce the double bond, is described in detail.

As the synthesizing method, a method described in JP-A No. 2003-335814 can be employed.

Base Used for Elimination Reaction

Preferable examples of the base used for introducing a double bond through the treatment with the base include hydrides, hydroxides, or carbonates of alkali metals, organic amine compounds, and metallic alkoxide compounds.

Preferable examples of the hydrides, hydroxides, or carbonates of alkali metals include sodium hydride, calcium hydride, potassium hydride, sodium hydroxide, potassium hydroxide, calcium hydroxide, potassium carbonate, sodium carbonate, potassium hydrocarbonate, sodium hydrocarbonate and the like.

Preferable examples of the organic amine compound include trimethylamine, triethylamine, diethymethyllamine, tributylamine, triisobutylamine, trihexylamine, trioctylamine, N,N-dimethylcyclohexylamine, N,N-dieyhylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperlidine, 2,2,6,6-tetramehylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, Schiff base, and the like.

Preferable examples of the metallic alkoxide compounds include sodium methoxide, sodium ethoxide, potassium t-butoxide and the like.

These bases can be used singly or in a combination of two or more of them.

An amount of the base used may be equal to, more than, or less than an equivalent amount relative to the double-bond precursor included in the compound.

A temperature in the elimination reaction may be set to a room temperature, a cooling temperature or a heating temperature. A preferable temperature ranges from −20° C. to 100° C.

A macromonomer can also be used as the polymerizable compound having the interaction-property group. The macromonomer can be produced by means of, for example, various production methods proposed in the second chapter of "*Synthesis of Macromonomers*" in "*Chemistry and Industry of Macromonomers*" (edited by Yuya Yamashita.) published by IPC Press on Sep. 20, 1989. Examples of specifically effective macromonomers used in the invention include macromonomers induced from a monomer including a carboxyl group such as acrylic acid or methacrylic acid, sulfonic acid compound macromonomers induced from monomers such as 2-acrylamide-2-methylpropane sulfonic acid, vinylstyrene sulfonic acid or salts thereof, amide compound macromonomers induced from a (meta) acrylamide, N-vinylacetamide, N-vinylformamide or N-vinylcarboxylic acid amide monomer, macromonomers induced from monomers including a hydroxyl group such as hydroxyethylmethacrylate, hydroxyethylacrylate or glycerolmonomethacrylate, and macromonomers induced from monomers including an alkoxy group or ethyleneoxide group such as methoxyethylacrylate, methoxypolyethyleneglycolacrylate or polyethyleneglycolacrylate. Further, a monomer having a polyethyleneglycol chain or polypropyleneglycol chain can also be effectively used as a macromonomer used in the present mode.

An effective molecular weight of the macromonomers ranges from 250 to 100,000, and preferably from 400 to 30,000.

A solvent used for the described composition including the polymerizable compound having the interaction-property group is not specifically limited as far as the polymerizable compound having the interaction-property group, and the hydrophilic monomer, which are the main constituents, can be dissolved in the solvent. A surfactant may be optionally added to the solvent.

Examples of the usable solvent include an alcohol solvent such as methanol, ethanol, propanol, ethyleneglycol, glycerin or propyleneglycolmonomethylether, acid such as acetic acid, a ketone solvent such as acetone or cyclohexanone, an amide solvent such as formamide or dimethylacetoamide, and the like.

Any surfactant can be added when necessary as far as it can be dissolved in the solvent. Examples of the usable surfactant include an anionic surfactant such as n-dodecylbenzene sodium sulfonate, a cationic surfactant such as n-dodecyltrimethyl ammonium chloride, a non-ionic surfactant such as polyoxyethylene nonylphenolether (as an example of a commercially available product, trade name: "EMULGEN 910, manufactured by Kao Corporation"), polyoxyethylene sorbitan monolaurate (as an example of a commercially available product, trade name: TWEEN 20), or polyoxyethylene laurylehter, and the like.

The compositions can be directly contacted in an arbitrary manner when the compositions are in liquid states. A coating amount in the case of forming the interaction-property region through a coating process is preferably 0.1 to 10 $g/m^2$, and more preferably 0.5 to 5 $g/m^2$, based on a solid component in order to obtain a uniform coating film and to sufficiently exert the interaction with the plating catalyst or the precursor thereof.

Formation of Region where Graft Polymer is Generated (Hydrophilic Pattern Layer) and Interaction-Property Region Next, the formation of the interaction-property region is described.

There is no particular limitation to the energy application method in the method of forming the interaction-property region. Any method, such as irradiation of light or heating, can be adopted as far as energy capable of generating the activation site on the polyimide base material surface and bonding the activation site to the polymerizable compound having the interaction-property group can be applied. However, active light irradiation is preferably used in view of obtaining a simplified device structure and reduce costs.

When the irradiation of active light is used in the pattern-shape exposure, either a scanning exposure based on the digital data or a pattern exposure using a lithographic film can be used. Regarding the method of forming the interaction-property region in the pattern shape, the respective pattern writing methods described in the description of the formation of the pattern forming layer in the pattern forming method (1) can also be preferably applied in the present mode.

When the energy is applied in the above-mentioned manner, the activation site generated on the polyimide base material surface and the polymerizable compound having the interaction-property group are polymerized, and a graft chain having a high mobility is thereby formed. As a preferable mode, when the polymerizable compound having the interaction-property group having the polymerizable group at the terminal and side chain thereof is used, the graft chain is further bonded to the polymerizable group at the side chain of the graft chain bonded to the base material and further to a particular polymerization initiating layer, and a branched graft chain structure is thereby formed thereby. In such a manner, a density and mobility of the formed graft can be remarkably improved, and a more intensified interaction with the electroless plating catalyst or the precursor thereof can be exhibited.

Imparting Electroless Plating Catalyst or Precursor Thereof to Interaction-Property Region The imparting process achieves imparting the electroless plating catalyst or precursor thereof to the interaction-property region formed in the pattern forming.

Electroless Plating Catalyst

The electroless plating catalyst used in the present process is mainly a zero valent metal, and examples thereof include Pd, Ag, Cu, Ni, Al, Fe, Co and the like. In the invention, Pd and Ag are preferable in terms of easy handling and superiority of catalyzing ability. Examples of methods for fixing the zero valent metal in the interaction-property region includes applying a metallic colloid in which a charge is adjusted so as to interact with the interaction-property group in the interaction-property region to the interaction-property region. In general, the metallic colloid can be produced by reducing the metal ion in a solution in which a charged surfactant or a charged protective agent is present. The charge of the metallic colloid can be adjusted by the used surfactant or protective agent. When the metallic colloid in which the charge is thus adjusted is made to interact with the interaction-property group of the graft pattern, the metallic colloid (electroess plating catalyst) can be selectively adsorbed onto the graft pattern.

Precursor of Electroless Plating Catalyst

As the precursor of the electroless plating catalyst used in the present process any substance can be employed without limitation as far as the substance can serve as the electroless plating catalyst through a chemical reaction, and the zero valent metal ion used in the electroless plating catalyst is mainly used. The metal ion, which is the precursor of the electroless plating catalyst, results in the zero valent metal serving as the electroless plating catalyst through a reduction reaction. The metal ion, which is the precursor of the electroless plating catalyst, is imparted to the base material, and then, may be changed into the zero valent metal through another reduction reaction before being dipped in an electroless plating catalyst plating bath to thereby constitute the electroless plating catalyst, or may be dipped in the electroless plating bath as the precursor of the electroless plating catalyst to be thereby changed into metal (electroless plating catalyst) by a reducing agent in the electroless plating bath.

The metal ion, which is the precursor of the electroless plating catalyst, is actually imparted to the graft pattern in the state of the metal salt. As the metal salt that is used any substance can be employed without limitation as far as the substance can be dissolved in an appropriate solvent and dissociated into the metal ion and base (anion). Specific examples of the metal salt include $M(NO_3)_n$, $MCl_n$, $M_{2/n}(SO_4)$, $M_{3/n}(PO_4)$ (in which M represents an n-valent metal atom) and the like. Examples of suitably used metal ion include the metal ions formed by dissociating the metal salts. Specific examples of the metal ion include an Ag ion, Cu ion, Al ion, Ni ion, Co ion, Fe ion, Pd ion and the like. The Ag ion and Pd ion are preferably used in terms of catalyzing ability.

As a method of imparting the metallic colloid as the electroless plating catalyst or the metal salt as the electroless plating precursor onto the graft pattern, the metallic colloid is dispersed in an appropriate dispersion medium or the metal salt is dissolved in an appropriate solvent so as to prepare a solution including the dissociated metal ion, and the solution is spread on the base material surface on which the graft pattern is present, or the base material having the graft pattern may be dipped in the solution. When the solution including the metal ion is brought into contact with the base material, the metal ion can be adsorbed to the interaction-property group on the interaction-property region utilizing an inter-ion interaction or a dipole-ion interaction, or the interaction-property region can be impregnated with the metal ion. In order to thoroughly perform the adsorption or impregnation, the concentration of the metal ion or concentration of the metal salt in the solution brought into contact, is preferably in the range of 0.01 to 50 mass %, and more preferably in the range of 0.1 to 30 mass %. A length of time required for the contact is preferably approximately one minute to 24 hours, and more preferably approximately five minutes to one hour.

Conducting Electroless Plating and Thereby Forming Metallic Film in Pattern Shape In the present process, the electroless plating is performed to the interaction-property region in the base material to which the electroless plating catalyst or precursor thereof is imparted, and the metallic film is thereby formed in the pattern shape. More specifically, when the electroless plating is performed in the present process, the high-density metallic film (metallic pattern) in accordance with the graft pattern obtained in the above-described process is formed on the graft pattern. The formed metallic pattern has a remarkable conductivity and adhesion property.

Electroless Plating

The electroless plating is an operation for depositing metal through a chemical reaction using a solution in which a metal ion, which is desirably deposited as plating, is dissolved.

In the electroless plating implemented in the present process, for example, the base material, to which the electroless plating catalyst is imparted in the pattern shape, is washed with water so as to remove any excess electroless plating catalyst (metal) and dipped in the electroless plating bath. A generally known electroless plating bath can be used for the electroless plating bath in the present invention.

Further, when the base material, to which the precursor of the electroless plating catalyst is imparted in the pattern shape, is dipped in the electroless plating bath in the state in which the precursor of the electroless plating catalyst is adsorbed to or impregnated into the graft pattern, the base material is washed with water so as to remove any excess precursor (metal salt) and dipped in the electroless plating bath. In this case, the precursor is reduced and subsequently subjected to the electroless plating in the electroless plating bath. Similarly to the above-described case, a generally known electroless plating bath can also be used for the electroless plating bath in the present process.

A composition of the general electroless plating bath mainly includes a metal ion for plating, a reducing agent, and an additive for improving the stability of the metal ion (stabilizer). In addition to the foregoing components, the plating bath may further include a conventionally-known additive, such as a stabilizer for the plating bath.

Generally known kinds of the metal used for the electroless plating bath include copper, tin, lead, nickel, gold, palladium and rhodium. Among these, copper and gold are preferably used in terms of conductivity.

Further, there are reducing agents and additives, which are respectively optimal for the metals described above. For example, a copper electroless plating bath includes $Cu(SO_4)_2$ as copper salt, HCOH as reducing agent, and an additive such as EDTA as a stabilizer for the copper ion or a chelating agent such as Rochelle salt. A plating bath used for the electroless plating of CoNiP includes cobalt sulfate and nickel sulfate as the metal salt thereof, hypophosphite sodium as a reducing agent, and sodium malonate, sodium malate or sodium succinate as complexing agent. A palladium electroless plating bath includes $(Pd(NH_3)_4)Cl_2$ as metal ion, $NH_3$ or $H_2NNH_2$ as a reducing agent, and EDTA as stabilizer. These plating baths may include substances other than those mentioned.

A thickness of the metallic film thus formed can be controlled by the concentration of the metal salt or metal ion in the plating bath, time length of dipping in the plating bath, or temperature in the plating bath. The thickness is preferably at least 0.5 µm, and more preferably at least 3 µm, in terms of conductivity. A length of time required for dipping in the plating bath is preferably approximately one minute to 12 hours, and more preferably approximately one minute to one hour.

It was confirmed through cross-sectional observations by means of an SEM that fine particles of the electroless plating catalyst and plating metal are densely dispersed in the surface graft film in the metallic film part of the metallic pattern obtained as described, and further that relatively large particles are deposited on the fine particles. Because the interface is in the hybrid state consisting of the graft polymer and fine particles, the adhesion property is favorable despite the unevenness being at most 100 nm or less at the interface between the base material (organic element) and inorganic substance (electroless plating catalyst or plating metal).

Electroplating

In the metallic pattern forming method according to the invention, electroplating (electroplating process) may be included after performing electroless plating and thereby forming the metallic film in the pattern shape.

In the electroplating process, the metallic film formed in performing electroless plating can be used as an electrode so as to further perform the electroplating after the electroless plating. As a result, an additional metallic film having an arbitrary thickness can be easily formed based on the metallic pattern having the superior adhesion property to the base material. When the electroplating process is added, the pattern-shaped metallic film can be adjusted to have an arbitrary thickness depending on the purpose thereof, which is favorable for applying the metallic pattern according to the invention to various applications such as a wiring pattern.

Conventionally-known methods of performing electroplating can be applied to the implementation of the electroplating according to the invention. Examples of metals usable in the electroplating in the present invention include copper, chrome, lead, nickel, gold, silver, tin, zinc, and the like. Copper, gold and silver are preferable, and copper is particularly preferable in terms of conductivity.

A thickness of the metallic film obtained by the electroplating varies depending on the use thereof and can be controlled by adjusting a concentration of the metal included in the plating bath, dipping time or current density. A film thickness used for general electric wiring is preferably at least 0.5 µm, and more preferably at least 3 µm, in terms of conductivity.

2. Conductive Pattern Material

The conductive pattern material of the invention is obtained by the above-described method of the invention, and characterized by having at least a metallic pattern including a base material that includes a polyimide having at least one structural unit selected from the group consisting of those represented by Formula (1) or Formula (2) and having a polymerization initiating site in a skeleton thereof, a graft polymer that directly bonds to a surface of the base material in a pattern shape; and a conductive substance. The conductive pattern material of the invention can be effectively used for forming various electric elements such as a flexible printed circuit, which requires a fine circuit, a TAB (Tape Automated Bonding) tape, a multi-layer circuit and the like.

The metallic pattern of the invention will now be described.

The metallic pattern of the invention is characterized in that: the surface irregularity of the surface of the base material is 100 nm or less; the metallic pattern is localized and formed with a metal film; and the adhesion between the base material and the metal film is favorable. In other words, whilst the surface of the base material is smooth, there is superior adhesion between the base material and the metal film.

The value of the surface irregularities is measured by taking cross sections at right angles to the surface of the base material, or the metallic pattern after formation, and then examining these cross sections using a scanning electron microscope.

Further, the value of the adhesion between the base material and the metal film is made by a 90 degrees-peeling test according to a conventionally-known test method of copper-clad laminates for printed wiring boards using the obtained metallic pattern (5 mm width).

Further, a dimensional change ratio, that is calculated in accordance with the equation below, can be given as an index of the dimensional stability of the conductive pattern material. After formation of the polyimide film, markings for measuring the dimensional change are made at two locations (a, b) by making holes using an NC drill. At this time the spacing of a to b is measured, giving the first length value L1. Then after forming the metallic pattern on the polyimide, the spacing of a to b is measured again, giving the second length value L2. Then, according to the calculation shown below, the ratio of the dimensional change before and after forming the metallic patter is calculated.

$$\text{Dimensional change ratio}(\%) = \frac{L1 - L2}{L2} \times 100$$

Generally, a metallic pattern having a superior high-frequency property can be obtained when the unevenness of the base material surface, that is, the interface between the metallic film and base material surface, is set to at most 100 nm. However, in cases of conventional metallic patterns, when the unevenness of base material surfaces is reduced, the adhesion property between the base material surfaces and metallic films is also reduced. Therefore, there is no choice but to roughen the base material surface through various methods and provide the metallic film on the roughened surface. Therefore, the interface unevenness in conventional metallic patterns is generally at least 1000 nm.

However, in the case of the metallic pattern formed according to the invention, the metallic film and the polymer directly chemically bonded to the base material are in the hybrid state, which enables the adhesion property between the base material and the metallic film to be maintained.

The metallic pattern formed according to the invention is characterized in that the base material having the surface whose unevenness is at most 100 nm is selected. The unevenness is more preferably selected from the range of 25 to 100 nm, and even more preferably from the range of 50 to 100 nm.

Thus, the metallic pattern formed according to the invention is superior in terms of the adhesion property between the base material and the metallic film while the unevenness is minimized at the base material interface.

EXAMPLES

Hereinafter, the present invention is described in detail referring to examples. However, the invention is not limited to the described examples.

Synthesis Example 1

Synthesis of Polyimide Precursor 1 (Polyamic Acid 1)

4,4'-diaminobenzophenone (28.7 mmol) was dissolved in N-methylpyrrolidone (30 ml) as a siamine compound in the presence of nitrogen and agitated at a room temperature for approximately 30 minutes.

p-phenylenebis(trimellitic acid monoester acid anhydride) (28.7 mmol) was added to the above solution at 0° C. and agitated for five hours. The reaction fluid was reprecipitated and a polyimide precursor 1 was obtained. The structure thereof was confirmed by means of $^1$H-NMR and FT-1R.

Synthesis Examples 2 to 8 and Comparative Synthesis Example 1

Polyimide precursors 2 to 8 and comparative polyamic acid 1 (polyamic acids 2 to 9), each of which has a composition shown in the following Table 1, were synthesized in a similar manner as in the synthesis example 1.

TABLE 1

|  | Tetracarboxylic acid dianhydride compound | Diamine compound |
|---|---|---|
| Synthesis Example 1 (Polyamic Acid 1) | p-phenylene-bis(trimellitic acid anhydride): 28.7 mmol | 4,4'-diamino benzophenone: 28.7 mmol |
| Synthesis Example 2 (Polyamic Acid 2) | p-phenylene-bis(trimellitic acid anhydride): 28.7 mmol | 1,2-bis(4-aminophenyl)-2,2-dimethoxyethanone: 28.7 mmol |
| Synthesis Example 3 (Polyamic Acid 3) | p-phenylene-bis(trimellitic acid anhydride): 28.7 mmol | 4,4'-diaminothioxanthone: 28.7 mmol |
| Synthesis Example 4 (Polyamic Acid 4) | 3,3',4,4''-benzaphenone tetracarboxylic acid dianhydride: 28.7 mmol | 4,4'-bis(4-amino-N-o-tolylbenzoamide): 28.7 mmol |
| Synthesis Example 5 (Polyamic Acid 5) | 3,3',4,4''-benzaphenone tetracarboxylic acid dianhydride: 28.7 mmol | 4,4'-bis (4-aminobenzoamide)-3,3'-dihidroxybiphenyl: 28.7 mmol |
| Synthesis Example 6 (Polyamic Acid 6) | 3,3',4,4''-benzaphenone tetracarboxylic acid dianhydride: 28.7 mmol | 4,4'-diaminodiphenylester: 28.7 mmol |
| Synthesis Example 7 (Polyamic Acid 7) | 3,3',4,4''-benzaphenone tetracarboxylic acid dianhydride: 28.7 mmol | bis(4-aminophenyl)terephthalate: 28.7 mmol |
| Synthesis Example 8 (Polyamic Acid 8) | 3,3',4,4''-benzaphenone tetracarboxylic acid dianhydride: 28.7 mmol | bis(4-aminophenyl)terephthalate: 14.3 mmol<br>4,4'-diamino benzophenone: 14.4 mmol |
| Comparative Synthesis Example 1 (Polyamic Acid 9) | 3,3',4,4''-benzaphenone tetracarboxylic acid dianhydride: 28.7 mmol | 4,4'-diamino diphenyl ether: 28.7 mmol |

Production of Polyimide Film

Each of the polyamic acids 1 to 8 and the comparative polyamic acid 1 synthesized in the above-mentioned method was dissolved in DMAc (manufactured by Wako Pure Chemical Industries, Ltd.) and formed into a solution of 30 wt %. The solution was spread on a glass substrate using a rod bar #36, dried at 100° C. for five minutes, heated at 250° C. for 30 minutes so as to solidify, and then was stripped off from the glass substrate. As a result, polyimide films 1 to 8 and comparative polyimide film 1 (respective thickness of 30 μm) were obtained.

Example 1

Pattern Forming

A pattern forming material was obtained by applying a coating liquid having the following composition on the polyimide film 1 prepared according to the above-mentioned method using a rod bar #18. A thickness of the film formed on the substrate was 0.8 μm.

Composition of Coating Liquid (Synthesized in the Following Method)

Polymer including a polymerizable group 0.25 g
Cyclohexanone 8.0 g

Method of Synthesizing Above-Described Polymer Including Polymerizable Group 58.6 g of 2-hydroxyethylmetahacrylate was put in a three-neck flask having a 500 ml capacity and 250 ml of acetone was added thereto and then agitated. 39.2 g of pyridine and 0.1 g of p-methoxyphenol were further added thereto, and then cooled down in a cooling bath using ice water. After a temperature of the mixed fluid reached 5° C. or below, 114.9 g of 2-bromoisobutanoic acid bromide was dropped therein by means of a dropping funnel over a period of three hours. After the dropping was completed, the mixed fluid was removed from the cooling bath and further agitated for three hours. The reaction mixed fluid was charged into 750 ml of water and agitated for one hour. The mixed fluid combined with water was extracted three times using 500 ml of acetic ether by means of separating funnel. An organic layer was washed sequentially with 500 ml of 1M hydrochloric acid, 500 ml of an aqueous solution of saturated sodium hydrocarbonate, and 500 ml of saturated salt water. The organic layer was provided with 100 g of magnesium sulfate, and dehydrated and dried, and then, filtrated. 120.3 g of a monomer A was obtained by vacuum-distilling the solvent.

Next, 40 g of N,N-dimethylacetamide was charged into a three-neck flask having a 1000 ml capacity and heated to 70° C. in the presence of nitrogen. 40 g of the N,N-dimethylacetamide solution including 12.58 g of the monomer A, 27.52 g of methacrylic acid and 0.921 g of a thermal polymerization initiating agent (trade name: V-601, manufactured by Wako Pure Chemical Industries, Ltd.) was dropped therein over a period of 2.5 hours. After the dropping was completed, the solution was heated to 90° C. and further agitated for two hours. The reaction solution was cooled down to room temperature and charged into 3.5 L of water so that a polymer compound was deposited. The deposited polymer compound was filtrated, washed with water and dried, and as a result, 30.5 g of the polymer compound was obtained. A weight average molecular weight of the obtained polymer compound was measured by means of a gel permeation chromatography method (GPC) in which a standard material was polystyrene, and the obtained result was 124.000.

26.0 g of the obtained polymer compound and 0.1 g of p-methoxyphenol were charged into a three-neck flask having a 200 ml capacity and dissolved in 60 g of N,N-dimethylacetamide and 60 g of acetone, and then cooled down in the cooling bath using ice water. After a temperature of the mixed fluid reached 5° C. or below, 60.4 g of 1,8-diazabicyclo [5.4.0]-7-undecene (DBU) was dropped therein over a period of one hour by means of a dropping funnel. After the dropping was completed, the fluid was removed from the cooling bath and further agitated for eight hours. The reaction fluid was charged into 2 L of water in which 17 ml of concentrated hydrochloric acid was dissolved, and a polymer including a polymerizable group was thereby deposited. The deposited polymer having the polymerizable group was filtrated, washed with water and dried. Then, 15.6 g of the polymer was obtained.

Pattern exposure was carried out with respect to the obtained film using a 1.5 kW high-pressure mercury-vapor lamp for one minute. The film obtained thereafter was washed with saturated baking soda water, and a graft pattern material having a graft polymer pattern in which the exposed part turned hydrophilic was obtained.

Electroless Plating

The graft pattern material A was dipped in an aqueous solution including 0.1 wt % of paladium nitrate (manufactured by Wako Pure Chemical Industries, Ltd.) for one hour, washed with ion-exchanged water, and subjected to electroless plating in an electroless plating bath containing the following composition at 30° C. for 20 minutes, and thus a conductive pattern material A was obtained.

| Composition of electroless plating bath | |
|---|---|
| OPC KAPPA -H T1 (trade name, an electroless plating solution manufactured by Okuno Chemical Industries Co., Ltd.) | 6 ml |
| OPC KAPPA-H T2 (trade name, an electroless plating solution manufactured by Okuno Chemical Industries Co., Ltd. | 1.2 ml |
| OPC KAPPA -H T3 (trade name, an electroless plating solution manufactured by Okuno Chemical Industries Co., Ltd.) | 10 ml |
| Water | 83 ml |

Example 2

The metallic pattern A was further subjected to electroplating in an electroplating bath containing the following composition for 15 minutes, and thus a conductive patter material B, in which a metallic pattern material B was formed, was obtained.

| Composition of electroplating bath | |
|---|---|
| Copper sulfate | 38 mg |
| Sulfuric acid | 95 g |
| Chloric acid | 1 ml |
| Brightening agent (trade name KAPPA-GREEM PCM, manufactured by Meltex Inc.) | 3 ml |
| Water | 500 ml |

Example 3

A conductive pattern material C, on which a metallic pattern C was formed, was obtained in the same manner as Example 1, except that the polyimide film 2 was used instead of the polyimide film 1.

Example 4

A conductive pattern material D, on which a metallic pattern D was formed, was obtained in the same manner as Example 1, except that the polyimide film 3 was used instead of the polyimide film 2, and an aqueous solution including 10 wt % of silver nitrate was used instead of the aqueous solution including 0.1 wt % of paladium nitrate.

Example 5

A conductive pattern material E, on which a metallic pattern E was formed, was obtained in the same manner as Example 4, except that the polyimide film 4 was used instead of the polyimide film 3.

Example 6

The polyimide film 5 was dipped in an aqueous solution including acrylic acid (10 wt %) and sodium periodic acid ($NaIO_4$, 0.01 wt %) and subjected to photoirradiation using a 1.5 kW high-pressure mercury-vapor lamp for ten minutes in an argon atmosphere. A film obtained as a result of the photoirradiation was washed with ion-exchanged water, and a substrate, in which acrylic acid was grafted, was obtained.

Next, an aqueous solution consisting of one liter of water, 40 g of N-ethyl-N'(3-dimethylaminopropyl) carbodiimide hydrochloride and 6 g of N-hydroxysuccinimide was prepared, and the substrate in which acrylic acid was grafted was dipped in the aqueous solution for one hour so that ester exchange was performed. Thereafter, 6 g of 2-nitrobenzylphenol was further added thereto and thereby reacted. Thus, a pattern forming material F having a pattern forming layer made of a polymer having a photodecomposable functional group was obtained.

The obtained pattern forming material F was subjected to image-wise exposure using a halogen lamp, and a graft pattern material F was produced.

Electroless Plating

The obtained pattern material F was dipped in an aqueous solution including 10 wt % of silver nitrate (manufactured by Wako Pure Chemical Industries, Ltd.) for ten minutes, washed with ion-exchanged water, and subjected to electroless plating in the same electroless plating bath used in Example 1 for three hours, and thus a conductive pattern material F was obtained.

Example 7

The polyimide film 6 was dipped in an aqueous solution including t-buthylacrylate (30 wt %, solvent: propyleneglycol mnomethylether (MFG)) and subjected to photoirradiation using a 1.5 kW high-pressure mercury-vapor lamp for fifteen minutes in an argon atmosphere. A film obtained as a result of the photoirradiation was washed with ion-exchanged water, and a pattern forming material G, in which poly-buthylacrylate was grafted, was obtained.

The obtained pattern forming material G was coated with a coating liquid having the following composition. A thickness of the film formed on the substrate was 0.5 μm.

| Composition of coating liquid | |
|---|---|
| Triphenylsulfoniumtriflate | 0.05 g |
| Methylethylketone (MEK) | 1 g |

Next, the obtained film was subjected to pattern exposure using a 1.5 kW high-pressure mercury-vapor lamp for one minute, and heated for two minutes at 90° C. The film obtained thereafter was washed with methylethylketone (MEK). Thus, a graft pattern material G, in which a functional group of the exposed part was converted into an adsorbing group so as to form an interaction-property region, was obtained.

Electroless Plating

The obtained pattern material G was dipped in an aqueous solution including 10 wt % of silver nitrate (manufactured by Wako Pure Chemical Industries, Ltd.) for one hour, washed with ion-exchanged water, and subjected to electroless plating in the same electroless plating bath used in Example 1 for 20 minutes at 30° C., and thus a conductive pattern material G was obtained.

Example 8

A conductive pattern material H, on which a metallic pattern H was formed, was obtained in the same manner as Example 7, except that the polyimide film 7 was used instead of the polyimide film 6.

Example 9

The polyimide film 8 was dipped in an aqueous solution including acrylic acid (10 wt %) and sodium periodic acid (NaIO$_4$, 0.01 wt %), covered with a PET film (25 µm in thickness), and subjected to pattern photoirradiation using a 1.5 kW high-pressure mercury-vapor lamp for ten minutes in an argon atmosphere. A film obtained as a result of the photoirradiation was sufficiently washed with ion-exchanged water, and a graft pattern material I, in which acrylic acid was grafted, was obtained.

Electroless Plating

The obtained graft pattern material I was dipped in an aqueous solution including 10 wt % of silver nitrate (manufactured by Wako Pure Chemical Industries, Ltd.) for ten minutes, washed with ion-exchanged water, and subjected to electroless plating in the same electroless plating bath used in Example 1 for 20 minutes at 30° C., and thus a conductive pattern material 1, on which a metallic pattern I was formed, was obtained.

Comparative Example 1

A conductive pattern material J for comparison, on which a metallic pattern J was formed, was obtained in the same manner as Example 2, except that the comparative polyimide film 1 was used instead of the polyimide film 1, and was further subjected to the electroless plating in the same manner as in Example 2.

Evaluation

Measurement of Fine Line Width of Metallic Pattern

Fine line widths of the metallic patterns A to J obtained in Examples 1 to 9 and Comparative example 1 were measured by means of an optical microscope (trade name: OPTIPHOTO-2, manufactured by Nikon Corporation). The measurement results are shown in the following Table 2.

Measurement of Metallic Film Thickness

The metallic patterns A to J obtained in Examples 1 to 9 and Comparative example 1 were cut vertically relative to the plane of the substrate by means of a microtome. Then, the cross-sectional surfaces were observed by means of an SEM so as to measure a thickness of each metallic film. The measurement results show an average of measurement at three points per sample, and are shown in the following Table 2.

Evaluation of Unevenness at Substrate Interface

When the metallic patterns A to J obtained in Examples 1 to 9 and Comparative example 1 were cut vertically relative to the plane of the substrate by means of the microtome and the cross-sectional surfaces were observed by means of an SEM, an unevenness in the substrate interface were confirmed. Next, three observation points on the substrate interface were randomly chosen for each sample, and a size of unevenness was represented by a difference between a height of a highest projection and a depth of a lowest recess at each observation point. An average of value at the three observation points was obtained. The measurement results are shown in Table 2.

Evaluation of Adhesion Property

Adhesion property of the conductive pattern materials A to J, in which the metallic patterns A to J obtained in Examples 1 to 9 and Comparative example 1, were evaluated by conducting the conventionally-known 90 degrees-peeling test method of copper-clad laminates for printed wiring boards with respect to the conductive pattern materials A to J, which were partially cut with a width of 5 mm, adhered with the polyimide film (thickness: 50 µm) on a surface thereof by using an epoxy adhesive (trade name: ARALDITE®, manufactured by Ciba-Geigy Chemical Corporation), and dried at 140° C. for 4 hours.

Evaluation of Heat Resistance

The conductive pattern materials A to J, in which the metallic patterns A to J obtained in Examples 1 to 9 and Comparative example 1 were formed, were heated at 300° C. for one hour. Next, the surfaces of the metallic patterns were reciprocatingly rubbed 50 times by hand using a cloth (trade name: BEMCOT, manufactured by Asahi Kasei Corporation) moisturized with water. After the rubbing was completed, the surfaces were observed using an optical microscope (trade name: OPTIPHOTO-2, manufactured by Nikon Corporation), and the heat resistances of the surfaces of the conductive pattern materials were evaluated in accordance with the following criteria. The evaluation results are shown in the following Table 2.

Evaluation Criteria

A: No change was observed.
B: Changes such as stripping of the metallic pattern or the like were observed.

Evaluation of Dimensional Stability

After forming the polyimide film, markings for measuring the dimensional change were made at two locations (a, b) by making holes using an NC drill. At this time the spacing of a to b was measured, giving the first length value L1. Then after forming the metallic pattern on the polyimide, the spacing of a to b was measured again, giving the second length value L2. Then, according to the calculation equation shown below, the ratio (%) of the dimensional change before and after forming the metallic patter was calculated.

$$\text{Dimensional change ratio}(\%) = \frac{L1 - L2}{L2} \times 100$$

The results are shown in Table 2.

TABLE 2

| | Conductive Patterning Material | Line Width (µm) | Metal Film Thickness (µm) | Substrate Surface Irregularities | Adhesion property (kN/m) | Heat Resistance | Dimensional stability (%) |
|---|---|---|---|---|---|---|---|
| Example 1 | A | 12 | 1.1 | 100 nm or less | 0.6 | A | +0.03 |
| Example 2 | B | 20 | 15 | 100 nm or less | 0.5 | A | +0.04 |
| Example 3 | C | 13 | 1.2 | 100 nm or less | 0.5 | A | +0.04 |

TABLE 2-continued

| | Conductive Patterning Material | Line Width (μm) | Metal Film Thickness (μm) | Substrate Surface Irregularities | Adhesion property (kN/m) | Heat Resistance | Dimensional stability (%) |
|---|---|---|---|---|---|---|---|
| Example 4 | D | 15 | 1.1 | 100 nm or less | 0.5 | A | +0.04 |
| Example 5 | E | 20 | 1.2 | 100 nm or less | 0.5 | A | +0.05 |
| Example 6 | F | 18 | 9 | 100 nm or less | 0.5 | A | +0.05 |
| Example 7 | G | 18 | 1.2 | 100 nm or less | 0.5 | A | +0.03 |
| Example 8 | H | 21 | 1.1 | 100 nm or less | 0.4 | A | +0.04 |
| Example 9 | I | 12 | 1.1 | 100 nm or less | 0.4 | A | +0.05 |
| Comparative Example 1 | J | 12 | 1.1 | 100 nm or less | 0.6 | A | -0.18 |

As is shown in Table 2, in the conductive pattern materials A to I of the Examples a good result was achieved for all of width of the metal patterns A to I, adhesion of the metal pattern to the base material, heat resistance and dimensional stability. In contrast to that it is clear that, in the base material of the Comparative Example 1, which does not contain the specific polyimide of the invention, whereas similar results were achievable for metal line width, adhesion, and heat resistance, the dimensional stability was inferior.

What is claimed is:
1. A metallic pattern forming method comprising:
forming a region in which a graft polymer, that directly bonds to a surface of a base material that includes a polyimide and has a functional group that interacts with either an electroless plating catalyst or a precursor thereof, is generated in a pattern shape;
imparting either an electroless plating catalyst or a precursor thereof; and
electroless plating so as to form a metallic film in the pattern shape,
wherein the polyimide has at least one structural unit selected from the group consisting of those represented by the following Formula (1) or Formula (2) and has a polymerization initiating site in a skeleton thereof:

Formula (1)

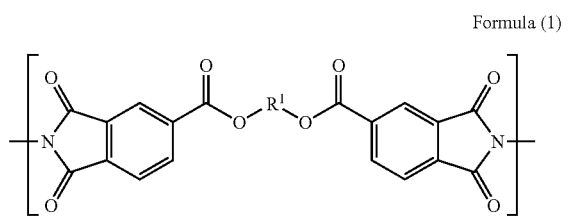

Formula (2)

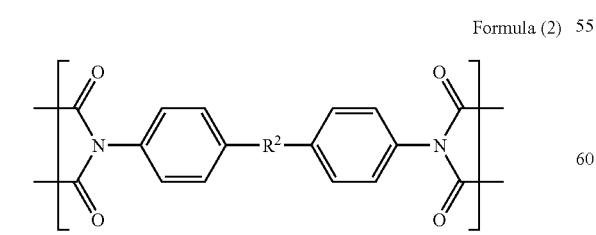

wherein $R^1$ represents a bivalent organic group selected from the group consisting of the structures represented by the following formulas, wherein: $R^{18}$ represents $CH_3$—, Cl—, Br—, F—, or $CH_3O$—; n represents an integer selected from 1 to 3; X represents a monovalent substituent group selected from the group consisting of a hydrogen atom, a halogen atom, a carboxyl group, a lower alkyl group having 1 to 6 carbon atoms, and a lower alkoxy group having 1 to 6 carbon atoms; each of Y and Z independently represents a monovalent substituent group selected from the group consisting of a hydrogen atom, a halogen atom, a carboxyl group, a lower alkyl group having 1 to 6 carbon atoms, and a lower alkoxy group having 1 to 6 carbon atoms; and A represents a bivalent linking group selected from the group consisting of an oxygen atom, a sulfur atom, wherein $R^1$ represents —CO—, —SO—, —$SO_2$— and —$CH_2$—;

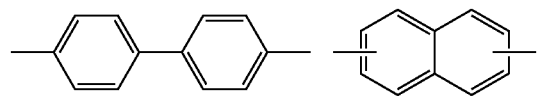

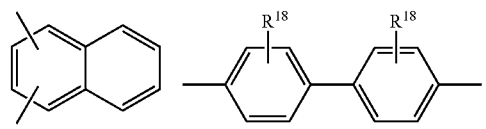

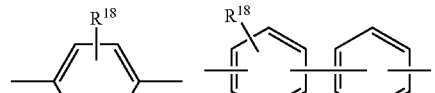

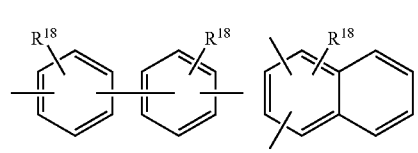

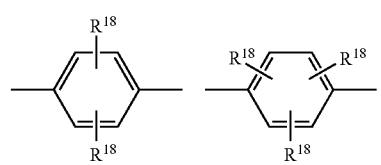

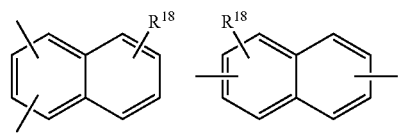

-continued

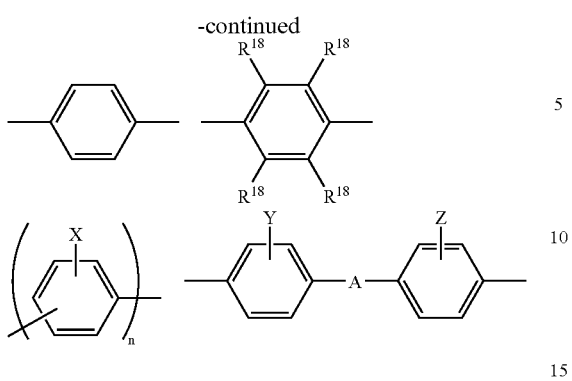

and R² represents a partial structure represented by one of the following Formulae (3) to (6);

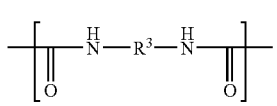  Formula (3)

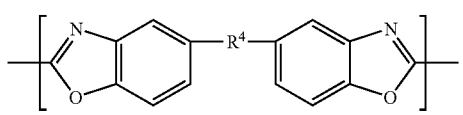  Formula (4)

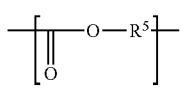  Formula (5)

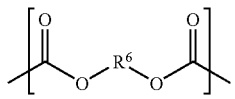  Formula (6)

wherein R³ represents a biavalent organic group selected from the group consisting of a straight-, branched-, or cyclic-alkyl group having 1 to 18 carbon atoms, an aralkyl group having 7 to 12 carbon atoms, an alkenyl group having 2 to 8 carbon atoms, an alkynyl group having 2 to 8 carbon atoms and an aromatic group having 6 to 18 carbon atoms;

R⁴ represents a single bond or a bivalent organic group selected from the group consisting of a straight-, branched-, or cyclic-alkyl group having 1 to 18 carbon atoms, an aralkyl group having 7 to 12 carbon atoms, an alkenyl group having 2 to 8 carbon atoms, an alkynyl group having 2 to 8 carbon atoms, and an aromatic group having 6 to 18 carbon atoms;

R⁵ represents a single bond, or a bivalent group selected from the group consisting of a straight-, branched-, or cyclic alkyl group having 1 to 18 carbon atoms, an aralkyl group having 7 to 12 carbon atoms, an alkenyl group having 2 to 8 carbon atoms, an alkynyl group having 2 to 8 carbon atoms, an aromatic group having 6 to 18 carbon atoms; and R⁶ represents a bivalent organic group selected from the group consisting of the structures represented by the following formulas, wherein: R²⁴ represents CH₃—, Cl—, Br—, F— or CH₃O—; n represents an integer selected from 1 to 3; B represents a monovalent substituent group selected from the group consisting of a hydrogen atom, a halogen atom, a carboxyl group, a lower alkyl group having 1 to 6 carbon atoms, and a lower alkoxy group having 1 to 6 carbon atoms; each of C and D independently represents a monovalent substituent group selected from the group consisting of a hydrogen atom, a halogen atom, a carboxyl group, a lower alkyl group having 1 to 6 carbon atoms, and a lower alkoxy group having 1 to 6 carbon atoms; and E represents a bivalent linking group selected from the group consisting of an oxygen atom, a sulfur atom, wherein R¹ represents —CO—, —SO—, —SO₂— and —CH₂—

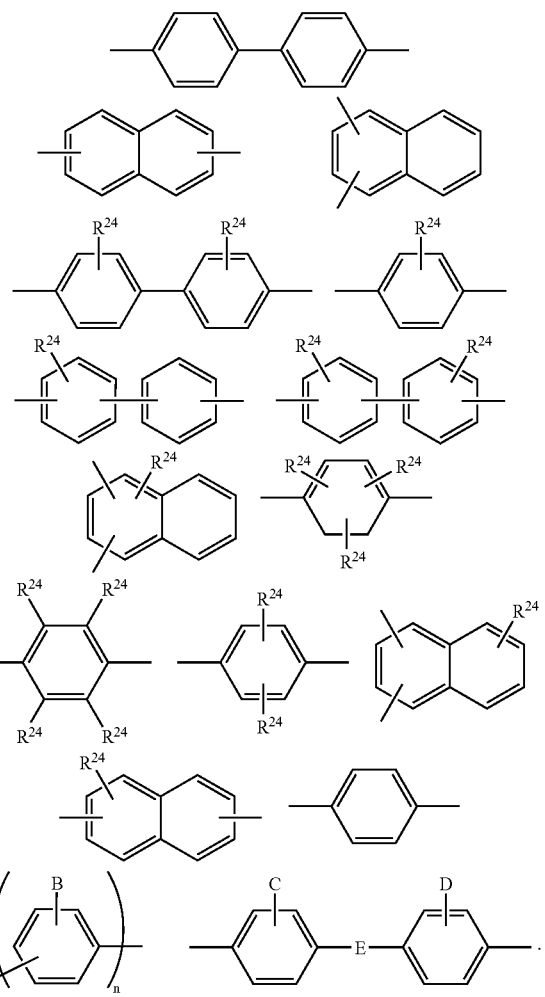

2. The metallic pattern forming method of claim 1, wherein forming the region in which the graft polymer is generated in the pattern shape includes:

applying heat or photoradiation to the surface of the base material so as to generate an activation site;

providing a polymer compound layer made of a polymer compound directly bonded to the base material surface and having a functional group whose chemical structure is changed so as to obtain or lose an ability to interact with either an electroless plating catalyst or a precursor thereof in response to heat, acid or radiation by using the activation site as a starting point; and applying heat, acid or photoradiation to the polymer compound layer in the pattern shape so that a pattern comprising a region which interacts with either an electroless plating catalyst or a precursor thereof is formed on the surface of the base material.

3. The metallic pattern forming method of claim 1, wherein forming the region in which the graft polymer is generated in the pattern shape includes:

bringing a compound having the polymerizable functional group and the functional group that interacts with either an electroless plating catalyst or a precursor thereof into contact with the surface of the base material;

photoirradiating the base material in the pattern shape to thereby generate an activation site on the surface of the base material, and generating the graft polymer on the surface of the base material in the pattern shape using the activation site as a starting point by means of graft polymerization so that a region which interacts with either an electroless plating catalyst or a precursor thereof is formed in the pattern shape.

4. The metallic pattern forming method of claim 1, further comprising conducting electroplating.

5. The metallic pattern forming method of claim 2, further comprising conducting electroplating.

6. The metallic pattern forming method of claim 3, further comprising conducting electroplating.

7. The metallic pattern forming method of claim 1, wherein the polymerization initiating site is included in a main chain of a polymer skeleton of the polyimide.

8. The metallic pattern forming method of claim 1, wherein the base material is formed by changing a structure of a polyimide precursor into a polyimide structure through a heating process.

9. The metallic pattern forming method of claim 1, wherein $R^5$ represents a single bond, or a bivalent group which is an aromatic group having 6 to 8 carbon atoms.

10. The metallic pattern forming method of claim 1, wherein $R^5$ represents a single bond.

* * * * *